(12) United States Patent
Tacklind et al.

(10) Patent No.: US 6,848,188 B2
(45) Date of Patent: Feb. 1, 2005

(54) LASER ALIGNMENT DEVICE PROVIDING MULTIPLE REFERENCES

(75) Inventors: Christopher A. Tacklind, Palo Alto, CA (US); Aragon Burlingham, Santa Cruz, CA (US); Jonathan Carver, Santa Cruz, CA (US); Thomas Zimmerman, Munich (DE); Wolfgang Ott, Antioch, CA (US)

(73) Assignee: Toolz, Ltd., Kowloon (HK)

( * ) Notice: Subject to any disclaimer, the term of this patent is extended or adjusted under 35 U.S.C. 154(b) by 25 days.

(21) Appl. No.: 09/928,244

(22) Filed: Aug. 10, 2001

(65) Prior Publication Data

US 2003/0145474 A1 Aug. 7, 2003

(51) Int. Cl.⁷ .................................................. G01C 5/00
(52) U.S. Cl. ........................................ 33/290; 33/391
(58) Field of Search .......................... 33/290, 291, 292, 33/391, 401; 318/603, 606

(56) References Cited

U.S. PATENT DOCUMENTS

| | | |
|---|---|---|
| 3,612,700 A | 10/1971 | Nelson |
| 3,729,266 A | 4/1973 | Mason et al. |
| 3,771,876 A | 11/1973 | Ljungdahl et al. |
| 3,823,313 A | 7/1974 | Unema |
| 4,062,634 A | 12/1977 | Rando et al. |
| 4,221,483 A | 9/1980 | Rando |
| 4,468,119 A | 8/1984 | Hamar |
| 4,751,782 A * | 6/1988 | Ammann ..................... 33/291 |
| 4,830,489 A | 5/1989 | Cain et al. |
| 4,973,158 A | 11/1990 | Marsh |
| 5,220,455 A | 6/1993 | Wilcken |
| 5,307,368 A | 4/1994 | Hamar |
| 5,572,797 A * | 11/1996 | Chase ......................... 33/286 |
| 5,680,208 A | 10/1997 | Butler et al. |
| 5,754,582 A | 5/1998 | Dong |
| 5,790,248 A * | 8/1998 | Ammann ..................... 33/283 |
| 5,796,176 A * | 8/1998 | Kramer et al. .............. 318/466 |
| 5,808,771 A | 9/1998 | Ohtomo et al. |
| 5,825,798 A | 10/1998 | Momiuchi et al. |
| 5,852,493 A * | 12/1998 | Monnin ....................... 33/291 |
| 5,903,345 A | 5/1999 | Butler et al. |
| 5,959,789 A | 9/1999 | Rando |
| 5,977,534 A | 11/1999 | Green et al. |
| 6,005,719 A | 12/1999 | Rando |
| 6,055,046 A * | 4/2000 | Cain ........................... 33/291 |
| 6,081,091 A * | 6/2000 | Mitchell et al. ............ 318/685 |
| 6,091,487 A | 7/2000 | Jackson et al. |
| 6,121,598 A | 9/2000 | Green et al. |

\* cited by examiner

*Primary Examiner*—G. Bradley Bennett
(74) *Attorney, Agent, or Firm*—Vierra Magen Marcus Harmon & DeNiro LLP

(57) ABSTRACT

A laser alignment device provides horizontal and vertical reference planes, lines, and points. The alignment device includes a pendulum assembly that supports a laser beam source assembly, two reflectors, and two motors. The laser beam source directs beams onto the reflectors—producing a horizontal reference beam and a vertical reference beam. Each reflector is rotated by one of the motors. Continuous rotation generates a reference plane; dithering generates a reference line, and no movement results in a reference point. The pendulum assembly includes a coarse pendulum that supports a fine pendulum, as well as the rotating motors and beam reflectors. The coarse pendulum roughly levels the alignment device. The fine pendulum supports the laser beam source assembly and brings the alignment device to a level position. The laser alignment device also includes a motor control system that enables users to accurately position the device's references.

62 Claims, 31 Drawing Sheets

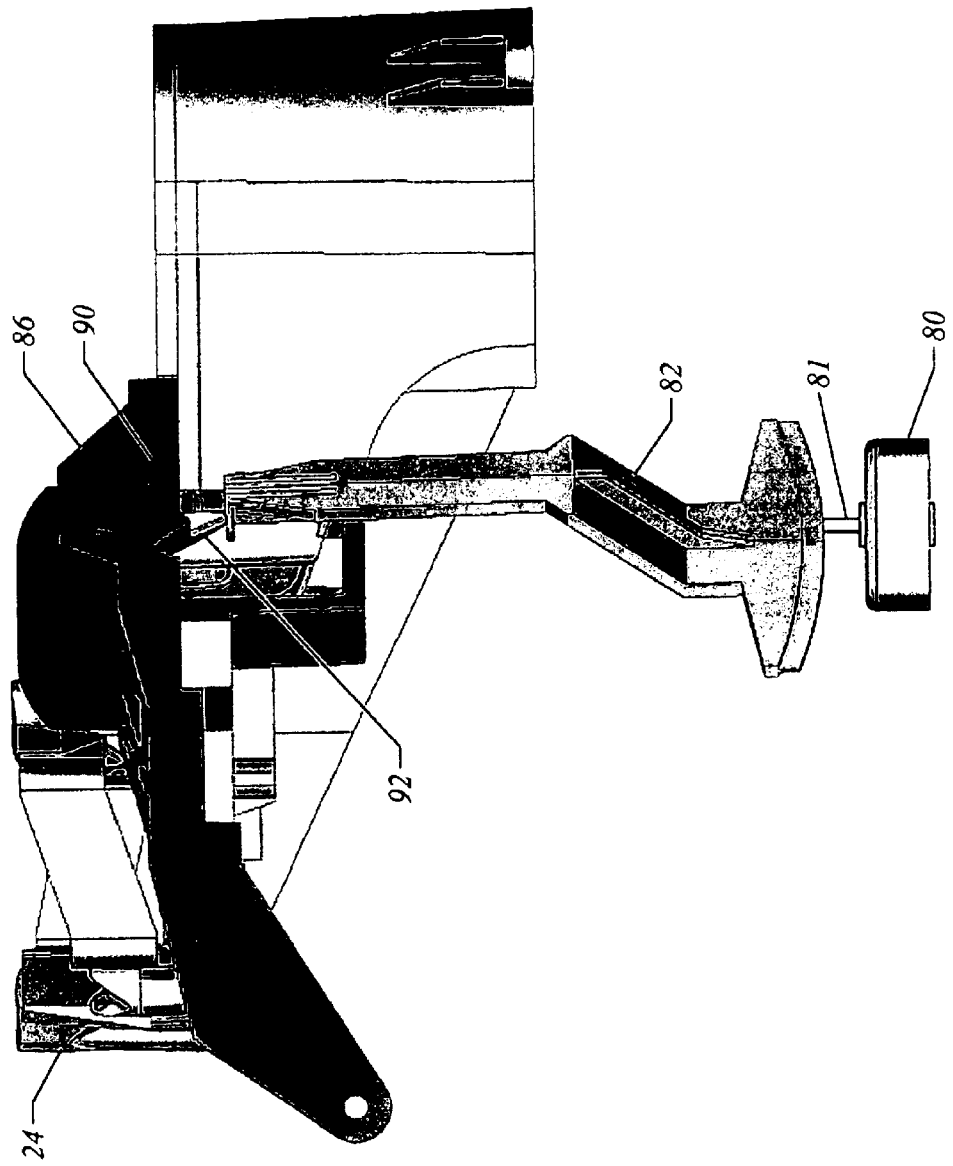

LASER ALIGNMENT DEVICE PROVIDING MULTIPLE REFERENCES

BACKGROUND OF THE INVENTION

1. Field of the Invention

The present invention is directed to the field of laser alignment devices.

2. Description of the Related Art

People undertaking construction and repair projects frequently require the use of reference lines. People employ reference lines on projects ranging from professional construction of large city buildings to amateur home improvement. For example, a person installing a border on the walls of a room requires a level reference line on each wall identifying a placement position for the border.

Traditional alignment tools for assisting in the manual placement of reference lines include straight edges, rulers, protractors, squares, levels, and plumb bobs. More recently, tool manufacturers have introduced laser alignment devices that provide references, such as points, lines, and planes. These laser alignment tools include, simple pointers, pointers with bubble vials, self-leveling pointers, multiple beam pointers, and devices producing a sheet of light.

It is desirable for a single alignment tool to provide multiple types of references, so the number of tools required for a job is reduced. In many instances a project requires the use of multiple references. For example, a project may require the use of reference points, lines, and planes. In many instances this requires the use of multiple alignment tools—forcing a person to have all of these tools available for the project. The purchase, maintenance, storage, and transportation of several alignment tools are undesirable inconveniences that consume time and money. In some circumstances it is simply impractical to have multiple alignment tools readily available on a job site.

Laser alignment devices could also benefit from improvements in self-leveling. A number of traditional systems employ a single pendulum self-leveling mechanism. In these devices, the single pendulum must provide leveling, while supporting an optical system connected to the device's power supply. This compromises the pendulum's leveling capability—making the design and manufacture of the single pendulum very difficult. Some single pendulum systems require users to manually provide initial leveling settings to reduce the burden on the single pendulum.

Adjusting the position of references in laser alignment devices provides additional challenges. Precise reference location is hard to achieve, due to the inaccuracies of motors used to position optical components. Cogging stiction in the motors inhibits a user's ability to accurately make small adjustments to a reference's location.

Laser beam alignment during device manufacturing also contributes to the difficulty of accurate reference positioning. Manufacturers traditionally mount laser diodes in alignment devices by placing the diode in a cylindrical casing and press fitting the casing into a cylindrical housing. The housing typically aligns the diode's beam with a lens and reflective optical components. Manufacturers make diode alignment adjustments by rotating and sliding the diode's cylindrical casing within the housing. This limits the degrees of adjustment available to alignment device manufacturers.

SUMMARY OF THE INVENTION

The present invention, roughly described, pertains to a laser alignment device that provides reference points, lines, and planes—reducing the number of alignment devices a user needs for a job site. The laser alignment device provides a horizontal set of references and a vertical set of references. For each set of references, users have the ability to select a plane, line, or pointing reference. In one version of the alignment device, users can also rotate the position of the vertical and horizontal reference points and lines.

The alignment device includes a self-leveling pendulum assembly—eliminating the need for a user to perform manual leveling. The pendulum supports a laser beam source assembly, two laser beam reflectors, and two motors. The laser beam source assembly generates two beams. Each beam is incident on one of the reflectors—producing a horizontal reference beam and a vertical reference beam.

Each reflector is coupled to one of the motors. A motor spins the coupled reflector to generate a reference plane. The motor dithers the coupled reflector to generate a reference line. At rest, the reflector produces a reference point. Each combination of a motor, reflector, and laser beam is aligned perpendicular to the other—causing the reference planes and lines from each combination to be orthogonal to reference planes and lines from the other combination.

The pendulum assembly includes a coarse pendulum and a fine pendulum. The coarse pendulum supports the fine pendulum, as well as the alignment device's rotating motors and beam reflectors. In one version of the alignment device, the coarse pendulum brings the device to within approximately 1-degree of being level. The fine pendulum supports the alignment device's beam source assembly. Without the burden of supporting the motors and reflectors, the fine pendulum brings the device's laser beams precisely to perpendicular and normal positions with respect to the force of gravity.

The laser alignment device also includes a motor control system that enables users to accurately position the device's point and line references. One version of the alignment device employs direct drive motors to rotate the beam reflectors. The pulse width and frequency of motor control signals determine the magnitude of motor rotation. The motors' rotation moves the reflectors to set the position of output reference points and lines.

The motor control system sets the motor control signal frequency and pulse width in response to a user input. The alignment device employs motor characterization data to convert the user's input into a motor signal frequency and pulse width—resulting in a motor rotation that accurately reflects the user's intended magnitude of rotation. The motors' characterization data is obtained during a calibration operation. For user convenience, one method of user input is the time period a user presses a button.

The motor control system also includes a yaw motor to adjust the horizontal position of the alignment device's vertical reference line. An arm containing a friction surface extends downward from a mounting bracket for the pendulum assembly. The arm's friction surface rests against a shaft extending from the yaw motor. When the yaw motor rotates, the shaft's rotation causes the pendulum mounting bracket to pivot—resulting in horizontal movement of the vertical reference line.

Versions of the laser alignment device further include spherical mounting joints for use in the laser beam sources. Laser diodes are mounted in spherical joints that are press fit into orthogonal cylindrical apertures in a mounting block. The spherical surfaces of the joints facilitate precise alignment of the laser diodes—providing more degrees of freedom for adjustment than the traditional solution of cylindrical casings.

Aspects of the present invention can be accomplished using hardware, software, or a combination of both hardware and software. The software used for the present invention is stored on one or more processor readable storage media including hard disk drives, CD-ROMs, DVDs, optical disks, floppy disks, tape drives, RAM, ROM or other suitable storage devices. In alternative embodiments, some or all of the software can be replaced by dedicated hardware including custom integrated circuits, gate arrays, FPGAs, PLDs, and special purpose computers.

These and other objects and advantages of the present invention will appear more clearly from the following description in which the preferred embodiment of the invention has been set forth in conjunction with the drawings.

BRIEF DESCRIPTION OF THE DRAWINGS

FIGS. 3a and 3b illustrate a yaw arm and yaw motor included in the laser alignment device shown in FIGS. 2a–2f.

DETAILED DESCRIPTION

I. External Operation

Figure 1A:
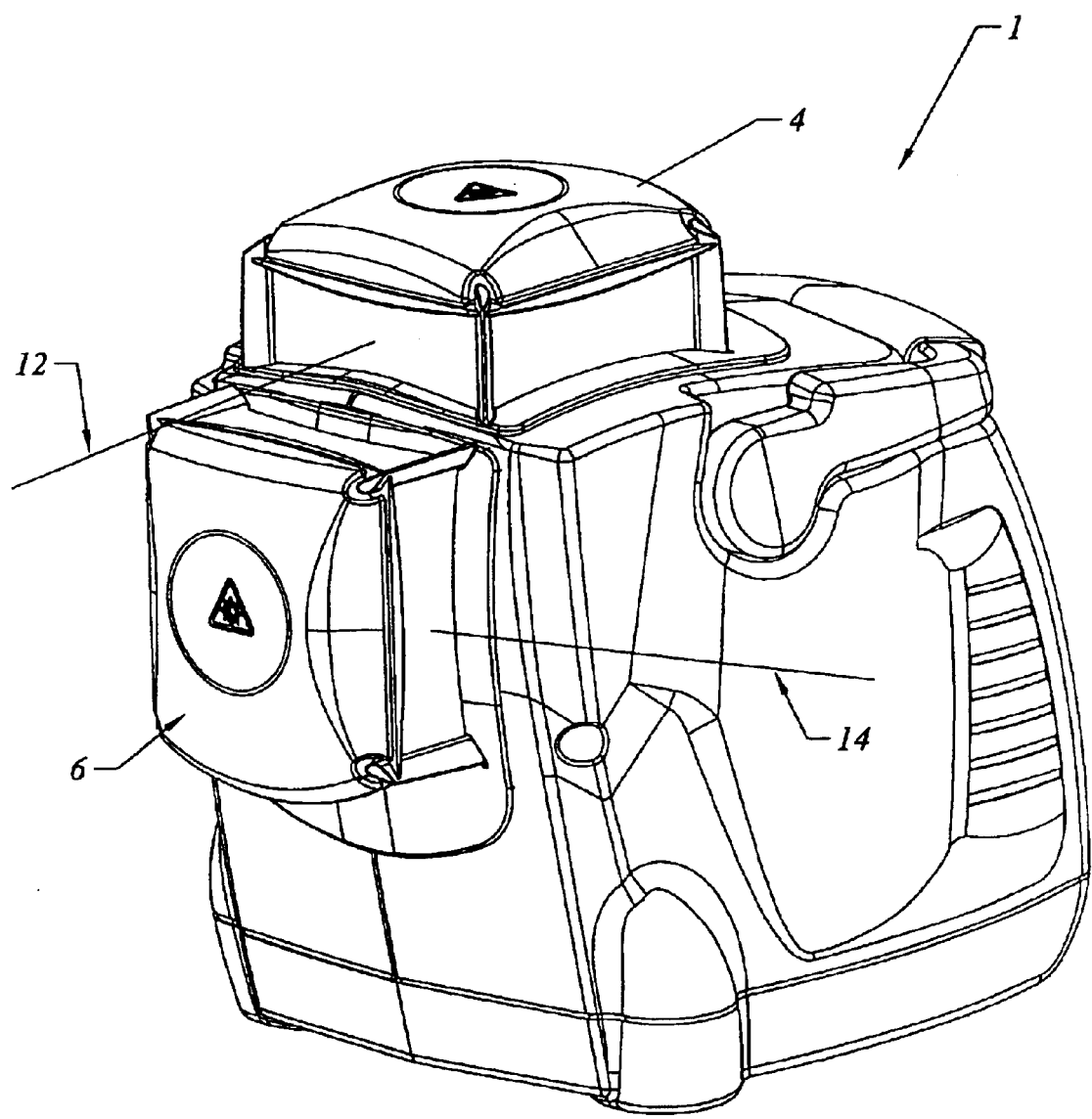
FIGS. 1a and 1b depict the exterior of a laser alignment device in accordance with the present invention.
Figure 1B:
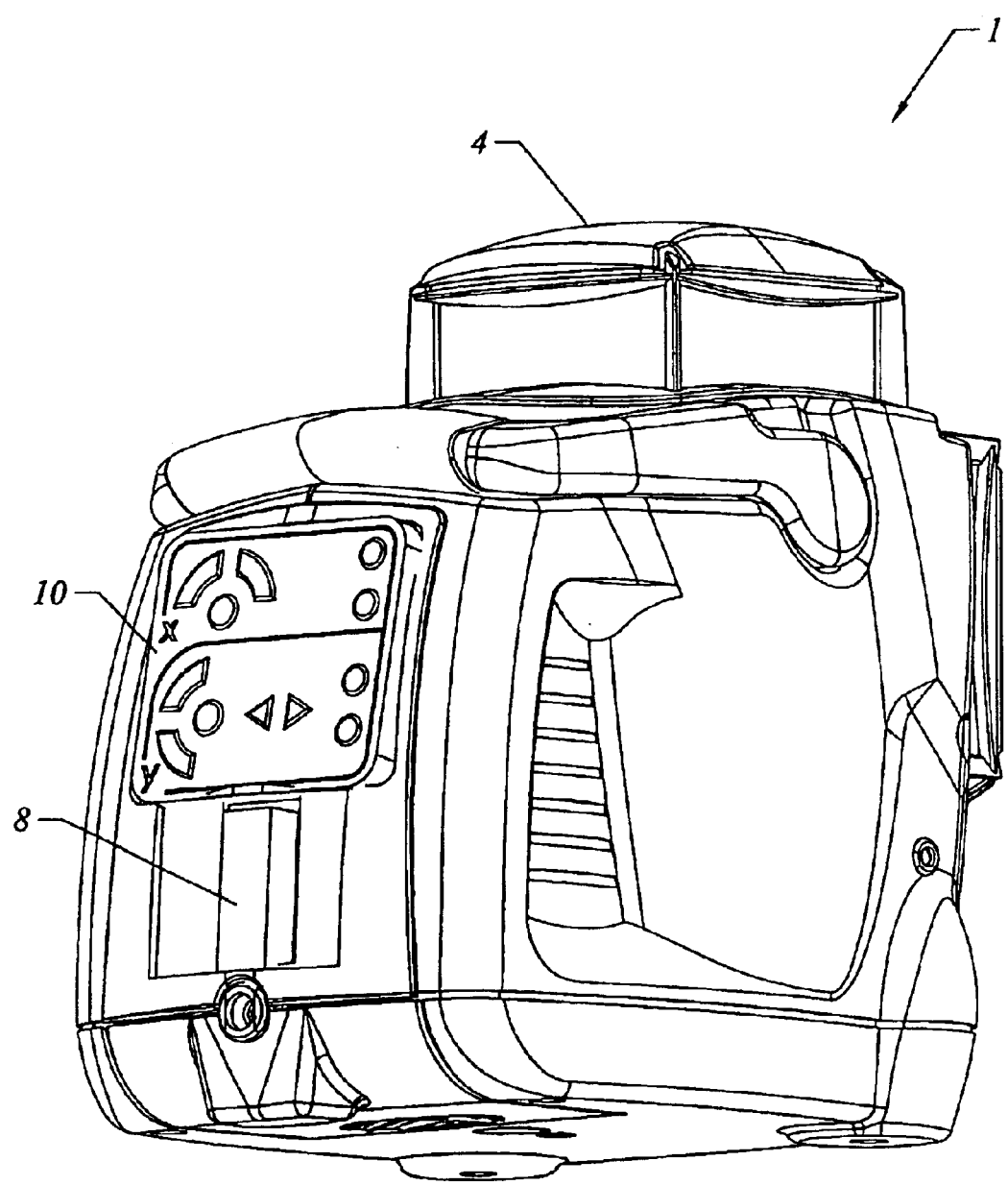

FIGS. 1a and 1b show a laser alignment device 1 in accordance with the present invention. Alignment device 1 includes horizontal beam turret 4 mounted on the top of device 1 and vertical beam turret 6 mounted on the side of device 1. Horizontal output beam 12 emanates from horizontal turret 4, and vertical output beam 14 emanates from vertical turret 6. Horizontal output beam 12 is perpendicular to vertical output beam 14. Horizontal output beam 12 is used to provide horizontal reference points, lines, and planes on incident surfaces. Vertical output beam 14 is used to provide vertical reference points, lines, and planes on incident surfaces.

Laser alignment device 1 has local user interface 10 and remote control receiver 8. Local interface 10 includes control buttons that enable users to control the operation of alignment device 1 for generating and positioning horizontal and vertical references. Remote control receiver 8 enables communication with a remote control, so a user can remotely direct the operation of alignment device 1. One skilled in the art will recognize that remote control receiver 8 can support any one of a number of different communication mediums and protocols. For example, in one embodiment, remote control receiver 8 supports radio frequency communication, while in another embodiment receiver 8 supports infrared signaling.

II. Internal Operation

Figure 2A:
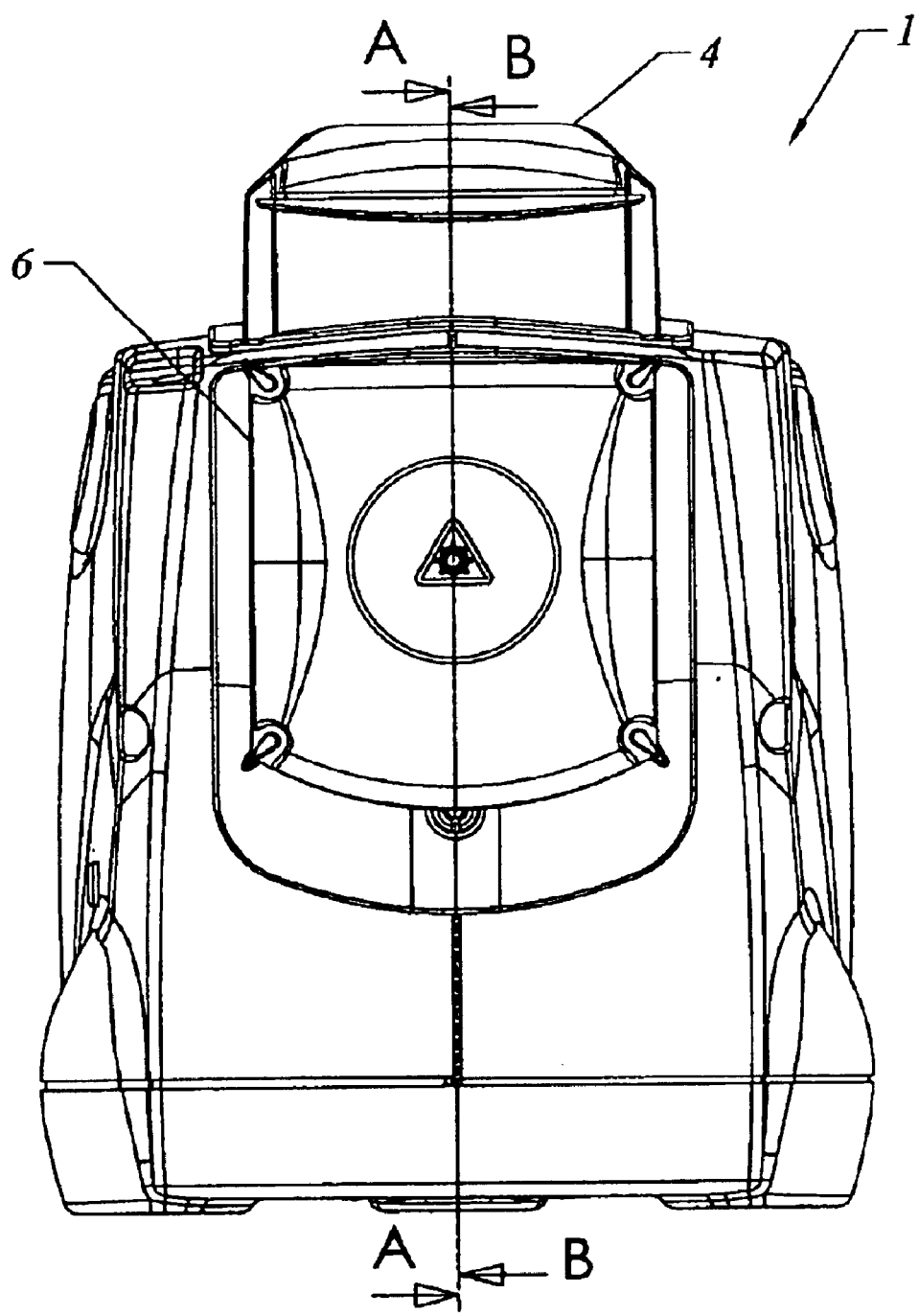
FIGS. 2a–2c show side cross-sectional views of the laser alignment device in FIG. 1.
Figure 2B:
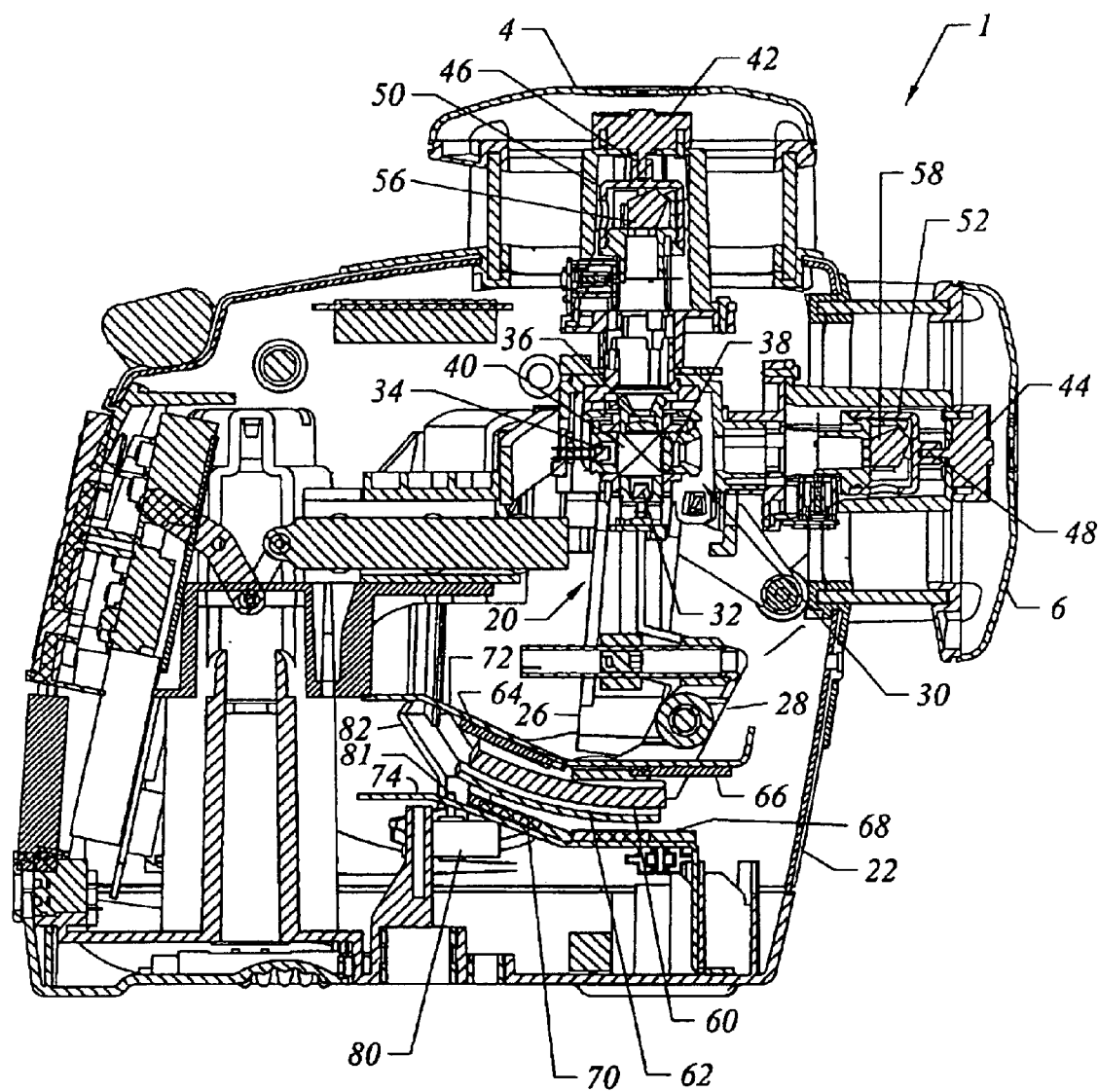
Figure 2C:
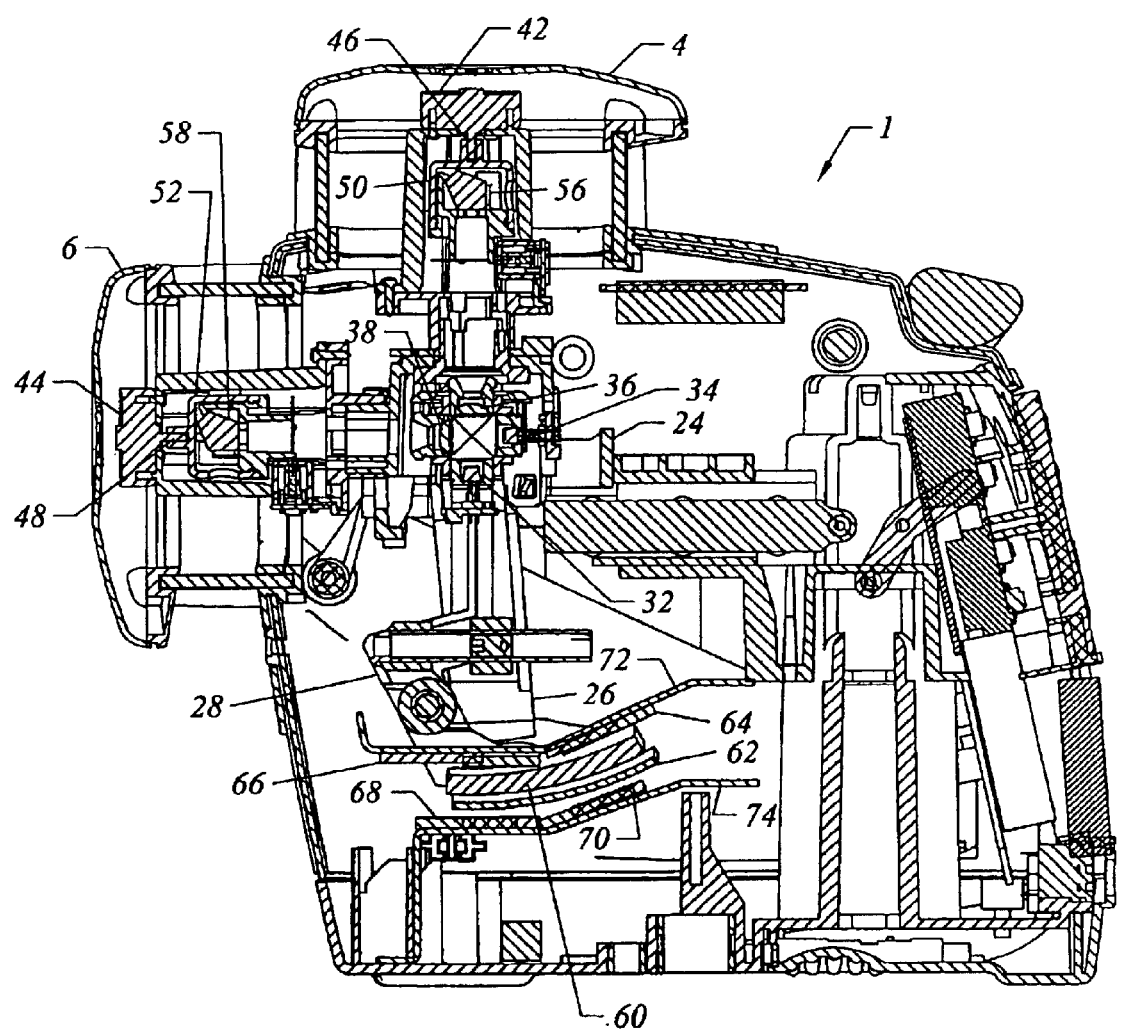
Figure 2D:
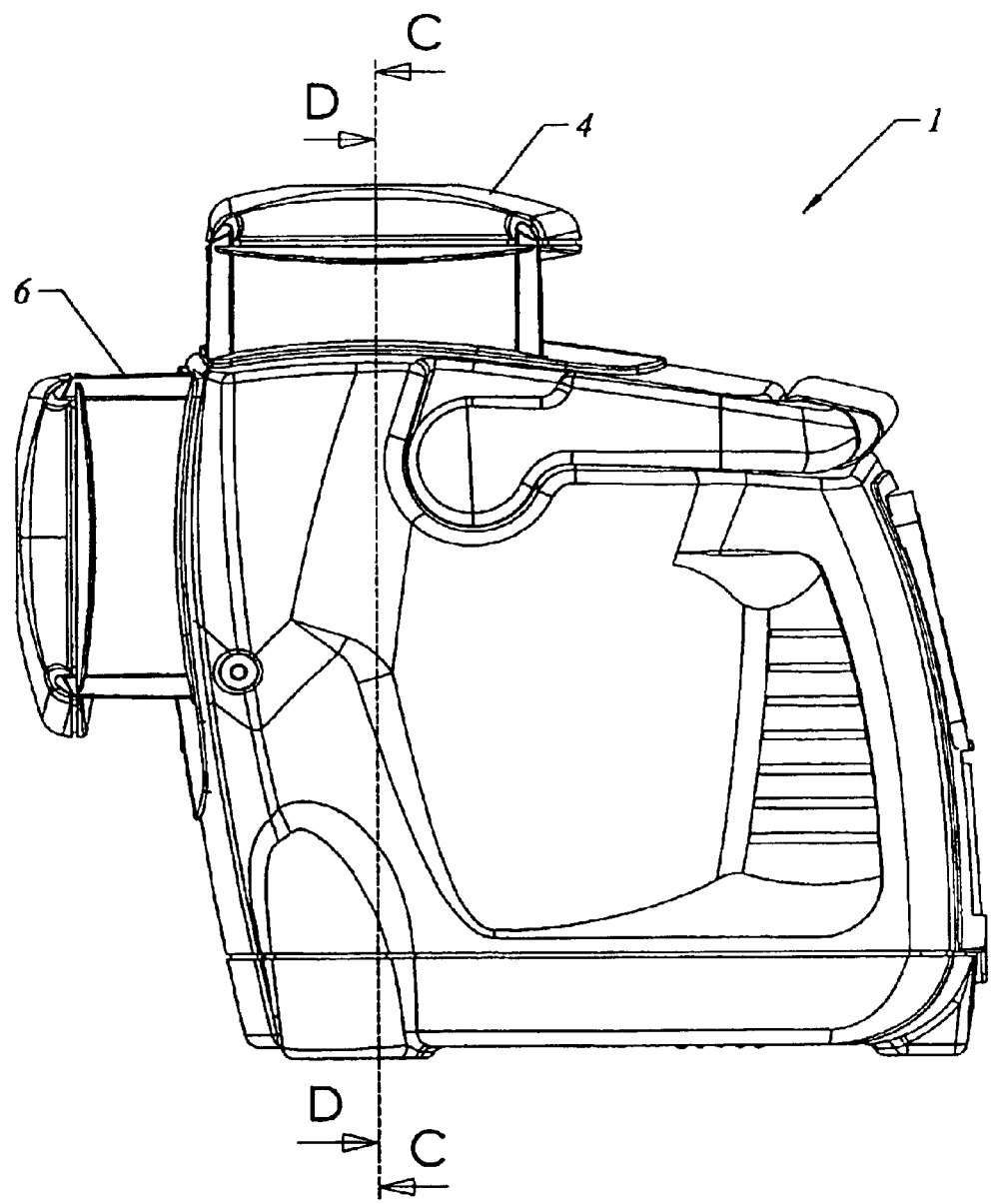
FIGS. 2d–2f show front and back cross-sectional views of the laser alignment device in FIG. 1.
Figure 2E:
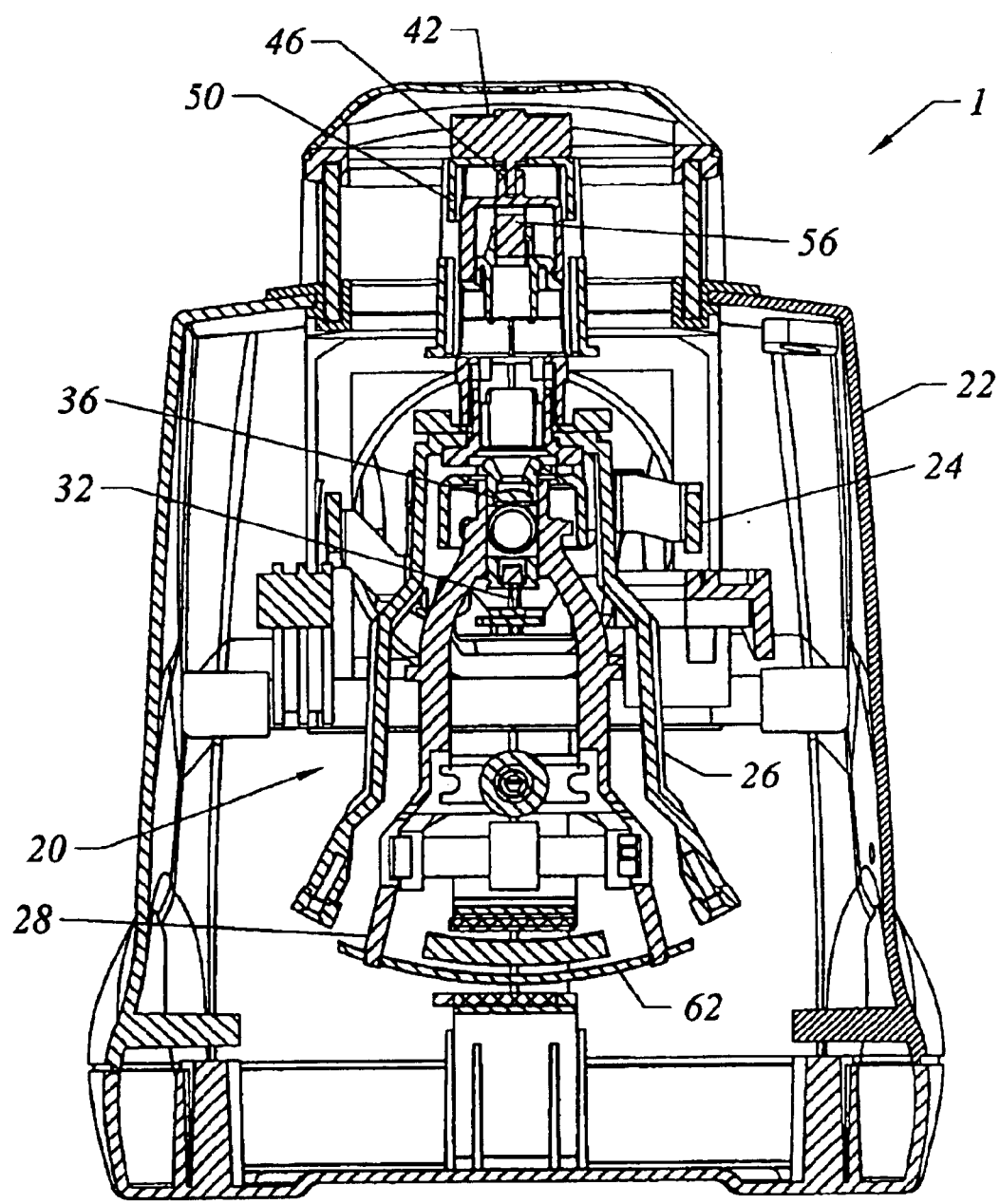
Figure 2F:
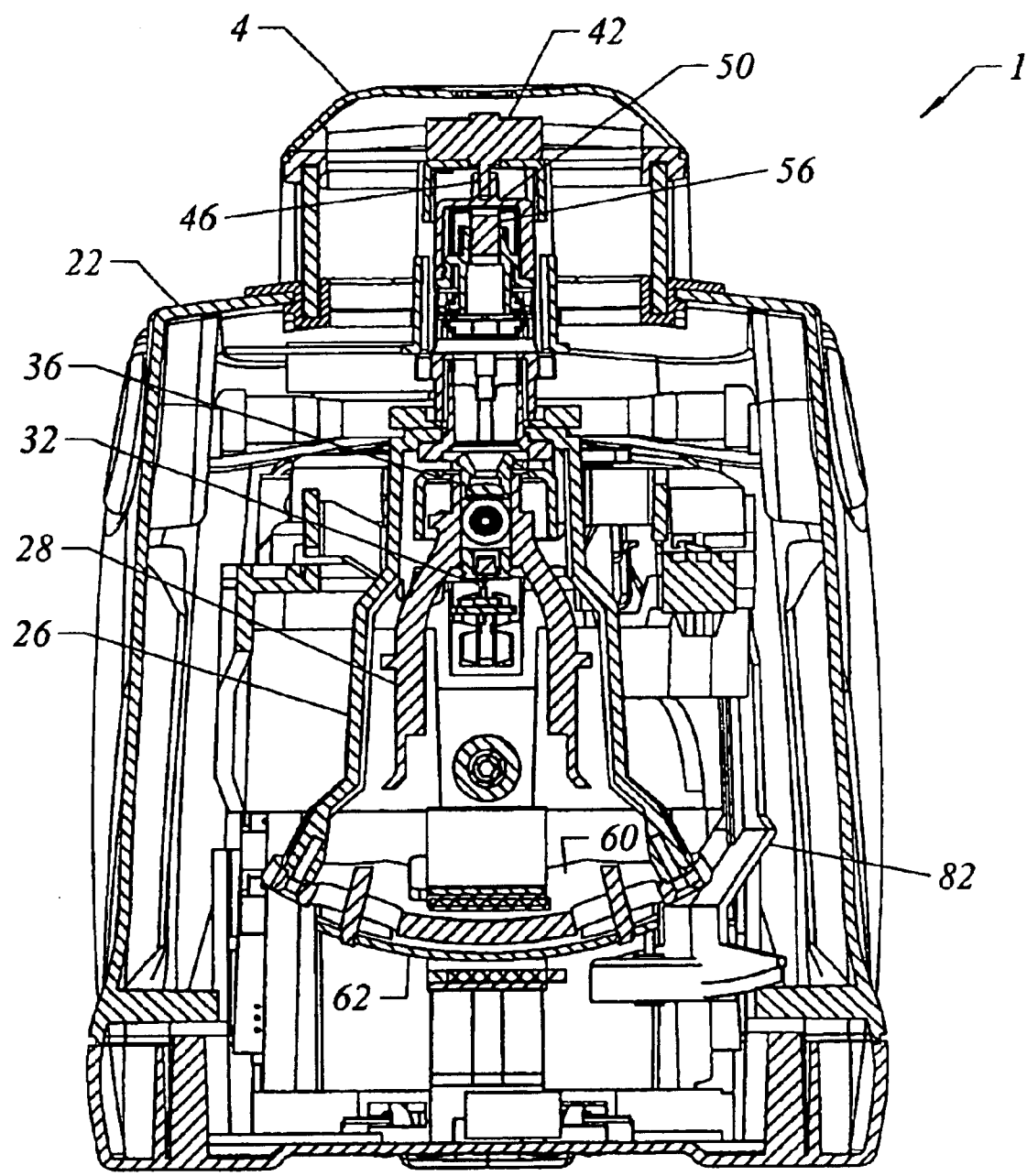

FIGS. 2a–2f show one implementation of laser alignment device 1 in accordance with the present invention. FIGS. 2b and 2c show side cross-sectional views from the perspective indicated in FIG. 2a. FIGS. 2e and 2f show front and back cross-sectional views from the perspective indicated in FIG. 2d.

Pendulum assembly 20 rests within pendulum mounting bracket 24. Pendulum assembly 20 includes coarse pendulum 26 and fine pendulum 28. Pendulum assembly 20 levels the optical components of alignment device 1, so that vertical output beam 14 is plumb. Magnified views of pendulum assembly 20 appear in FIGS. 4a–4d, and further details about pendulum assembly 20 appear below.

Laser beam source assembly 30 is mounted on fine pendulum 28, which is mounted on coarse pendulum 26. Laser beam assembly 30 includes mounting block 40, which houses laser diodes 32 and 34 and collimating lenses 36 and 38. Diodes 32 and 34 are mounted so that there beams have an orthogonal relationship to each other and pass through lenses 36 and 38, respectively. Laser beam source assembly 30 is described in greater detail below.

Horizontal beam motor 42 is mounted at the top of coarse pendulum 26, so that motor shaft 46 is aligned with the center of the collimated beam from diode 32. Motor shaft 46 is coupled to mounting structure 50, which holds penta-prism 56. Penta-prism 56 is mounted to receive the collimated laser beam from laser diode 32. Penta-prism 56 bends the collimated laser beam 90-degrees to form horizontal output beam 12.

Alignment device 1 generates horizontal reference planes by spinning penta-prism 56 using motor 42. Alignment device 1 generates horizontal reference lines by dithering penta-prism 56 with motor 42—motor 42 alternately moves penta-prism 56 between two points. At rest, horizontal output beam 12 from penta-prism 56 creates a horizontal reference point on incident surfaces. Motor 42 rotates penta-prism 56 to adjust the horizontal position of reference lines and points.

Vertical beam motor 44 is mounted to the side of coarse pendulum 26, so that motor shaft 48 is aligned along the center of the collimated beam from diode 34. Motor shaft 48 is coupled to mounting structure 52, which holds penta-prism 58. Penta-prism 58 is mounted to receive the collimated laser beam from laser diode 34. Penta-prism 58 bends the beam 90-degrees to form vertical output beam 14.

Alignment device 1 generates vertical reference planes by spinning penta-prism 58 using motor 44. Alignment device 1 generates vertical reference lines by dithering penta-prism 58 with motor 44—motor 44 alternately moves penta-prism 58 between two points. At rest, vertical output beam 14 from penta-prism 58 creates a vertical reference point on incident surfaces. Motor 44 rotates penta-prism 56 to adjust the vertical position of reference points and lines.

Figure 3B:
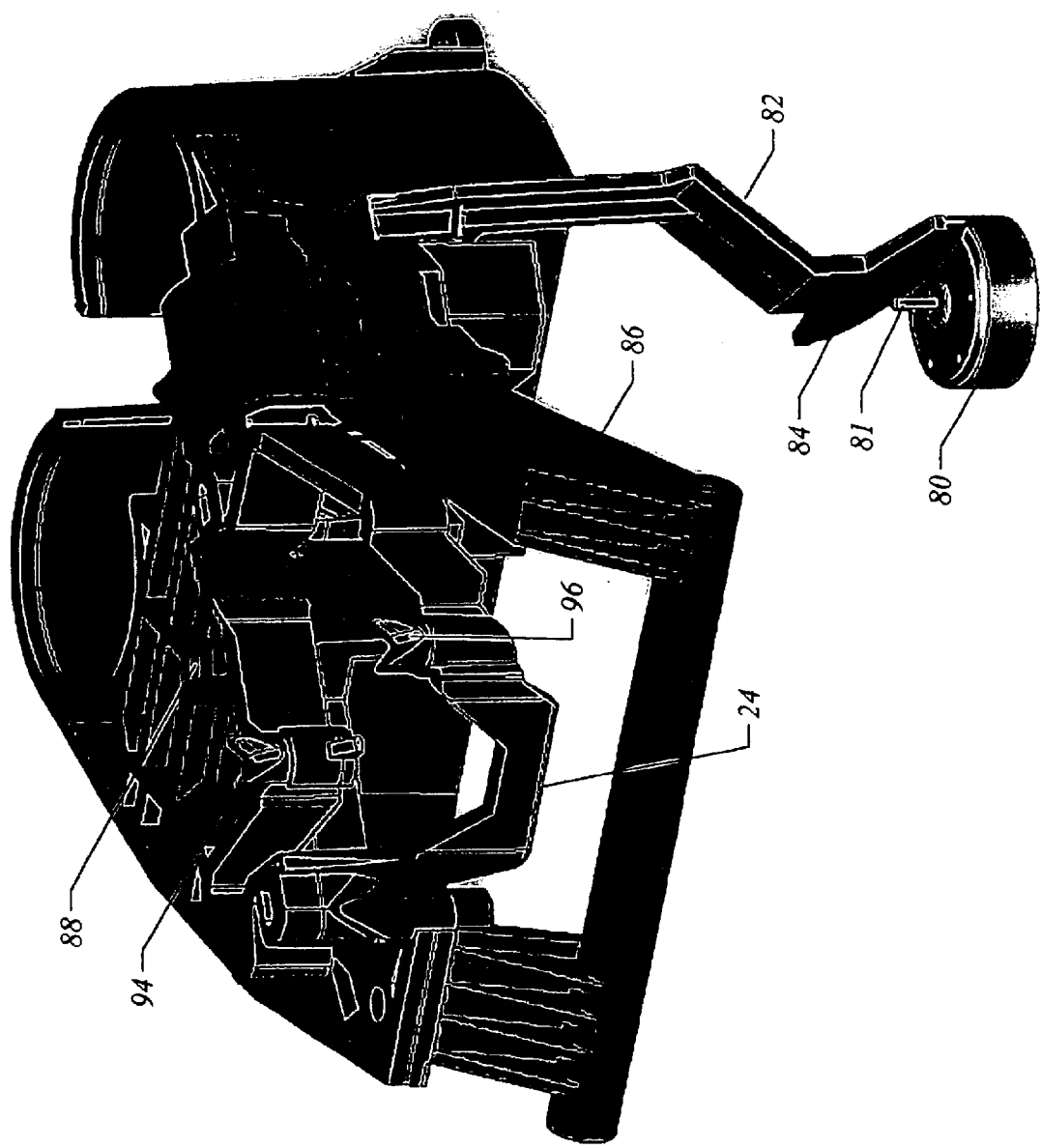
Figure 4A:
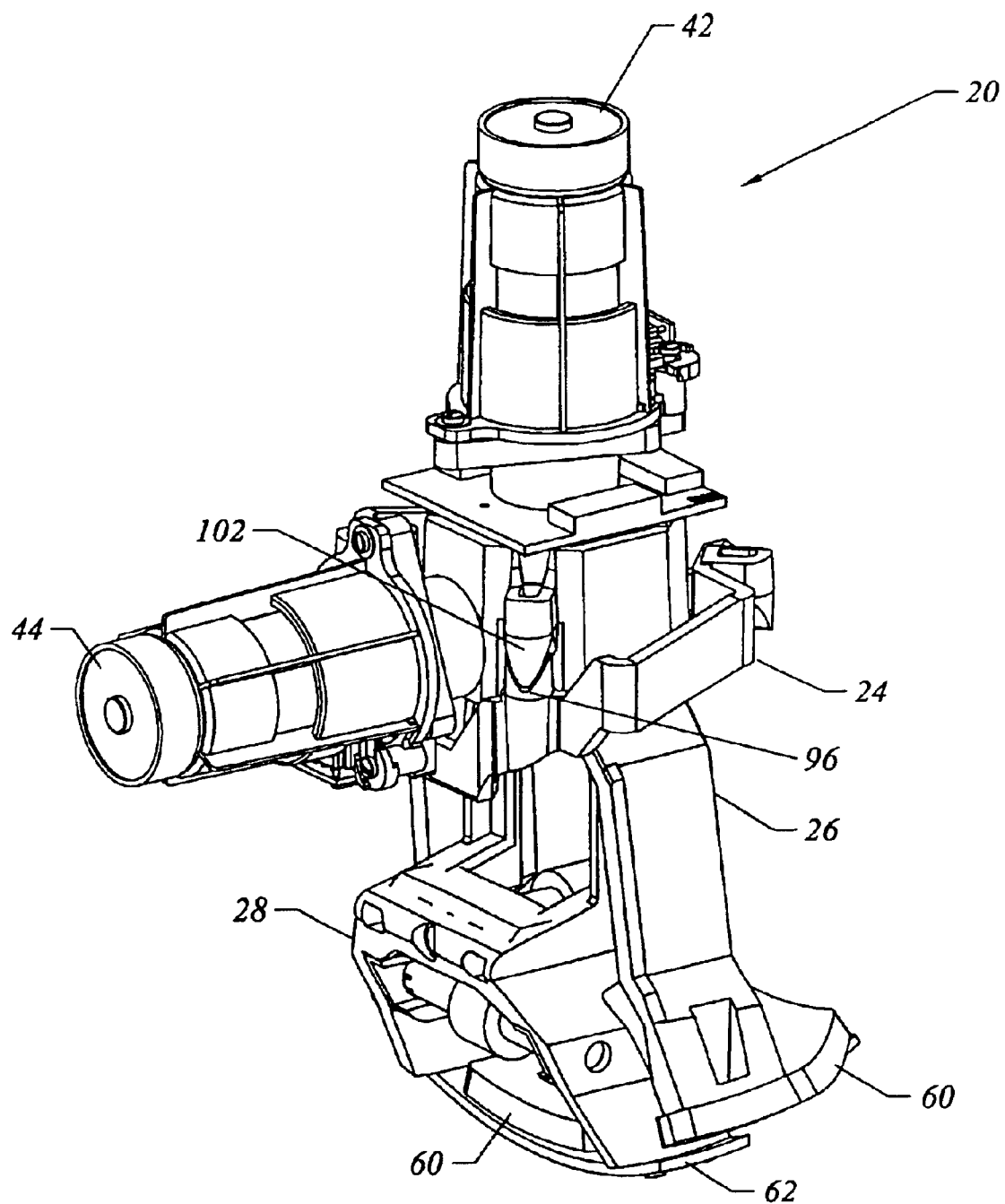
FIGS. 4a–4d illustrate the dual pendulum assembly for the laser alignment device in FIGS. 2a–2f.
Figure 4B:
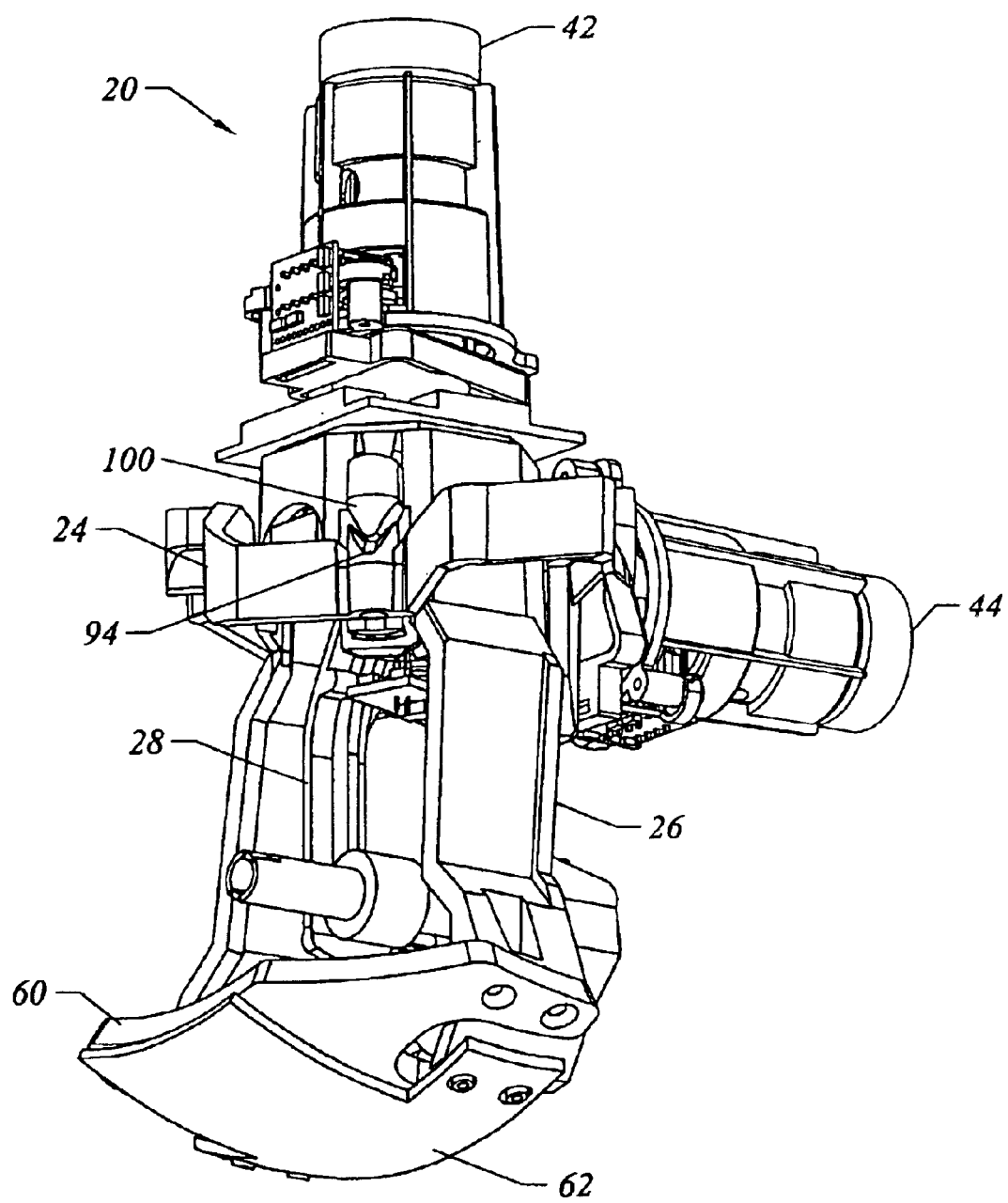
Figure 4C:
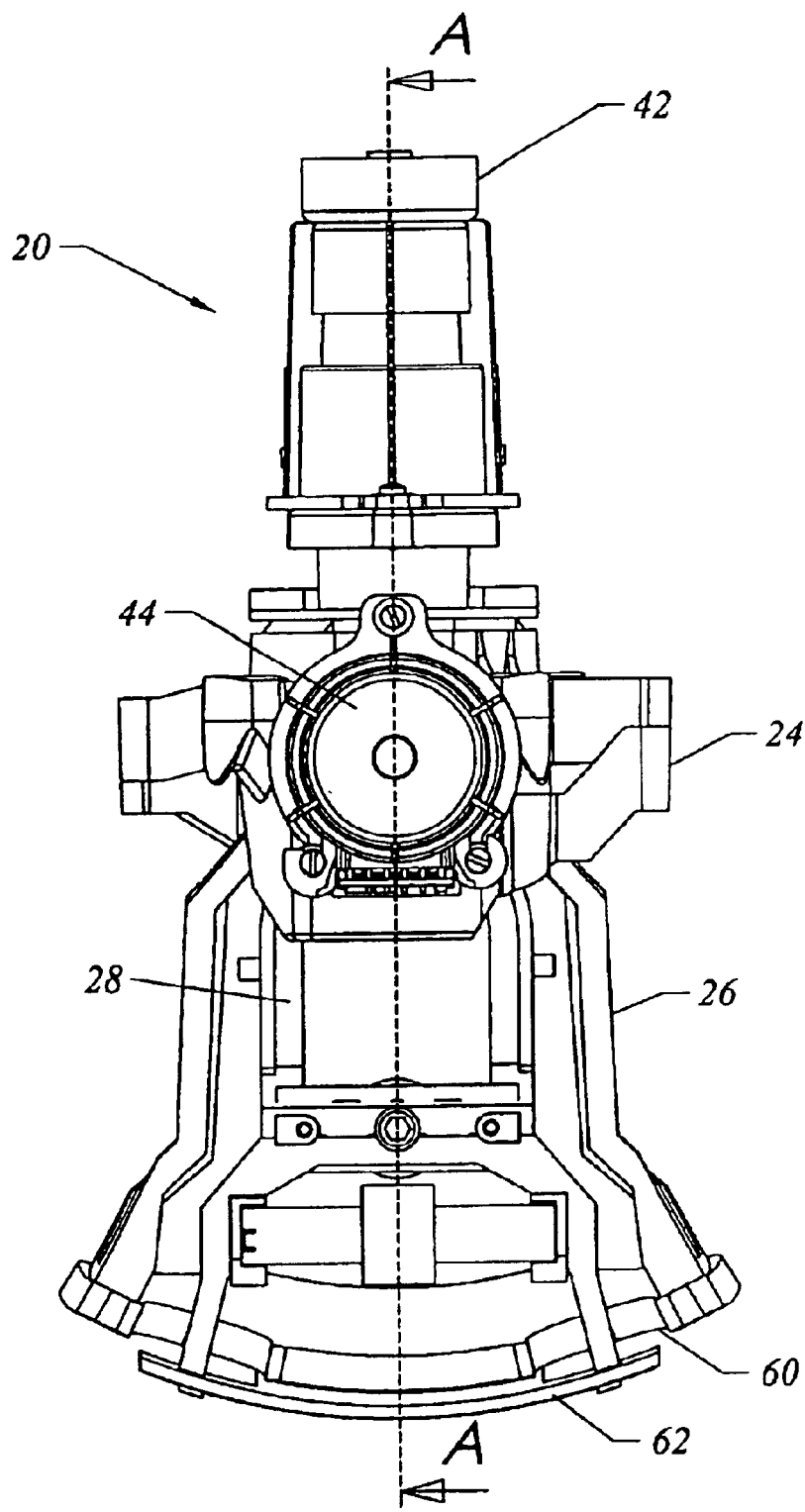
Figure 4D:
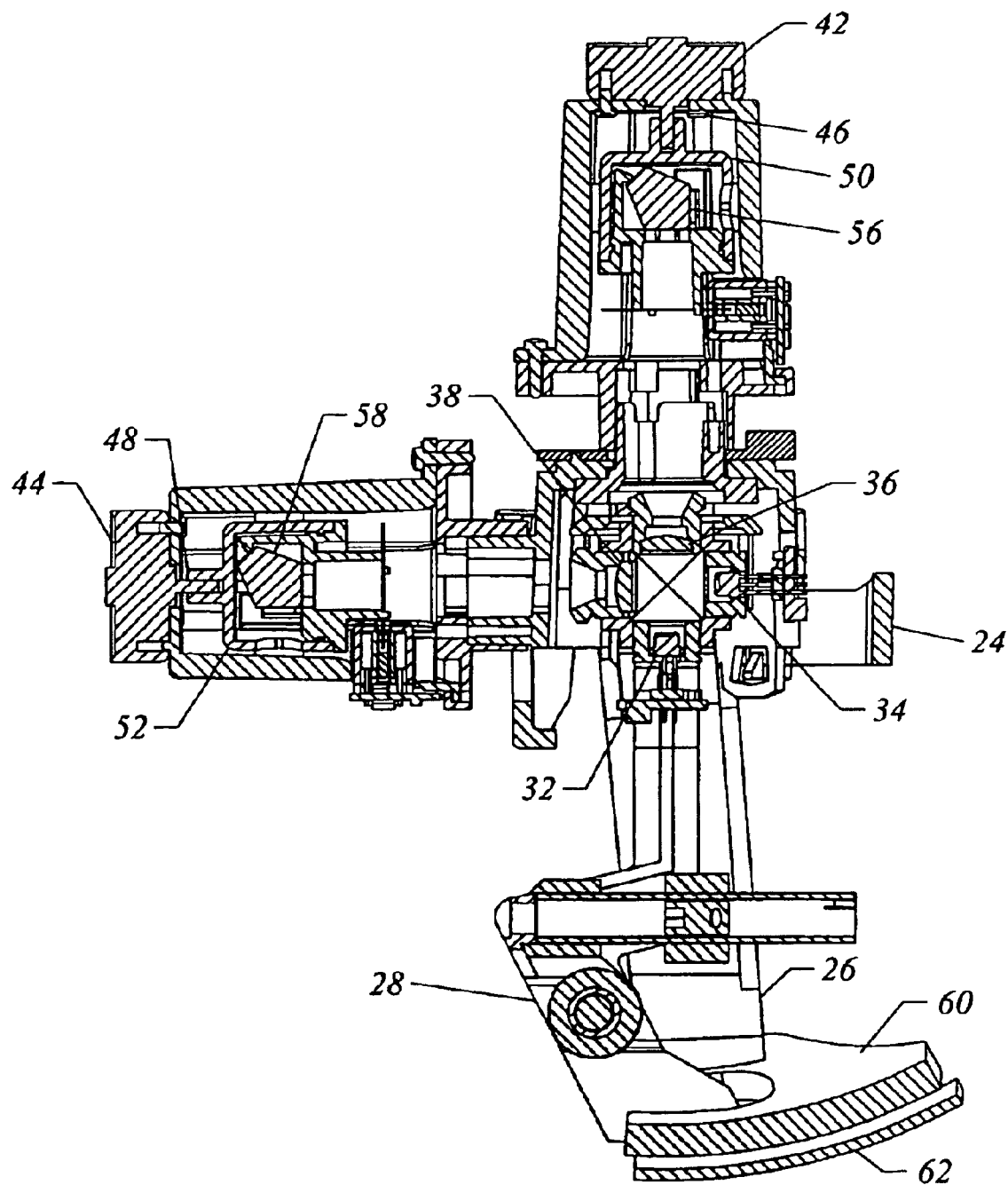

For adjusting the horizontal position of vertical reference lines, alignment device 1 includes yaw motor 80 and yaw arm 82 (FIG. 2b). As shown in FIGS. 3a and 3b, yaw arm 82 is mounted to extend downward from pendulum mounting bracket 24. Support member 86 is rigidly mounted to housing 22. Pendulum mounting bracket 24 is attached to support member 86 at point 88 to pivot about point 88. In one implementation, bracket 24 is attached to member 86 at point 88 using saddle joints. Support member 86 includes tab 90, which rests in notch 92 of pendulum mounting bracket 24.

Friction surface 84 is located at the bottom end of yaw arm 82 and rests against shaft 81 of yaw motor 80. When motor 80 rotates, friction between surface 84 and shaft 81 causes yaw arm 82 to move in the direction of rotation. In one version of yaw arm 82, surface 84 is rubberized. Alternatively, a rubber mount is placed on surface 84. The movement of yaw arm 82 results in mounting bracket 24 pivoting about point 88. This causes the rotation of pendulum assembly 20, which rests in notches 94 and 96 of mounting bracket 24. The rotation of pendulum assembly 20 horizontally moves the position of vertical output beam 14. In one implementation, yaw motor 80 is a direct drive motor, such as the motors found in compact disc players.

Alignment device 1 damps the motion of pendulum assembly 20 to aid pendulum assembly 20 in coming to rest and remaining at rest. In one implementation, alignment device 1 implements magnetic damping with magnets 64, 66, 68, and 70. In alternate implementations of device 1, different damping mechanisms are employed, such as fluid or air damping.

Base 60 of coarse pendulum 26 and base 62 of fine pendulum 28 swing between rigid support members 72 and 74, which are mounted to housing 22. Magnets 64 and 66 are mounted on the side of member 72 that faces pendulum bases 60 and 62. Magnets 68 and 70 are mounted on the side of member 74 that faces bases 60 and 62. Magnetic field lines form between magnets 64 and 70, and magnetic field lines form between magnets 66 and 68. The motion of bases 60 and 62 through the magnetic field damps the motion of the bases, which are formed of copper in one version of alignment device 1. In alternate embodiments, bases 60 and 62 are formed from different conductive material, such as brass.

III. Pendulum Assembly

Supporting the motors and penta-prisms of alignment device 1 detracts from a pendulum's ability to accurately level. In addition to supporting the weight of these components, the pendulum must compensate for forces caused by the power supply wires running to the motors. Pendulum assembly 20 overcomes these challenges by mounting the penta-prisms and motors on coarse pendulum 26—leaving fine pendulum 28 free to achieve more accurate leveling. While supporting the motors and penta-prisms, coarse pendulum 26 brings pendulum assembly 20 to within approximately 1-degree of being level. After the coarse leveling of pendulum 26, fine pendulum 28 only has a relatively small leveling burden to resolve to bring pendulum assembly 20 to a level position.

FIGS. 4a–4d provide views of dual pendulum assembly 20, as explained above with respect to FIGS. 2a–2f. FIGS. 5a–5d provide views of coarse pendulum 26, and FIGS. 6a–6d provide views of fine pendulum 28. Coarse pendulum 26 includes arms 103 and 104 terminating in base 60. Fine pendulum 28 includes arms 120 and 122 terminating in base 62. Fine pendulum arms 120 and 122 swing within coarse pendulum arms 103 and 104.

As shown in FIGS. 4a, 4b, 5a, and 5b, coarse pendulum 26 rests on notches 94 and 96 of mounting bracket 24. Coarse pendulum includes tabs 100 and 102 resting in notches 94 and 96, respectively. Coarse pendulum 26 swings about an imaginary axis extending between tab 100 and tab 102. The contact radius for the tab-notch combination is the distance the axis of rotation is offset from the tips of tabs 100 and 102.

Figure 5A:
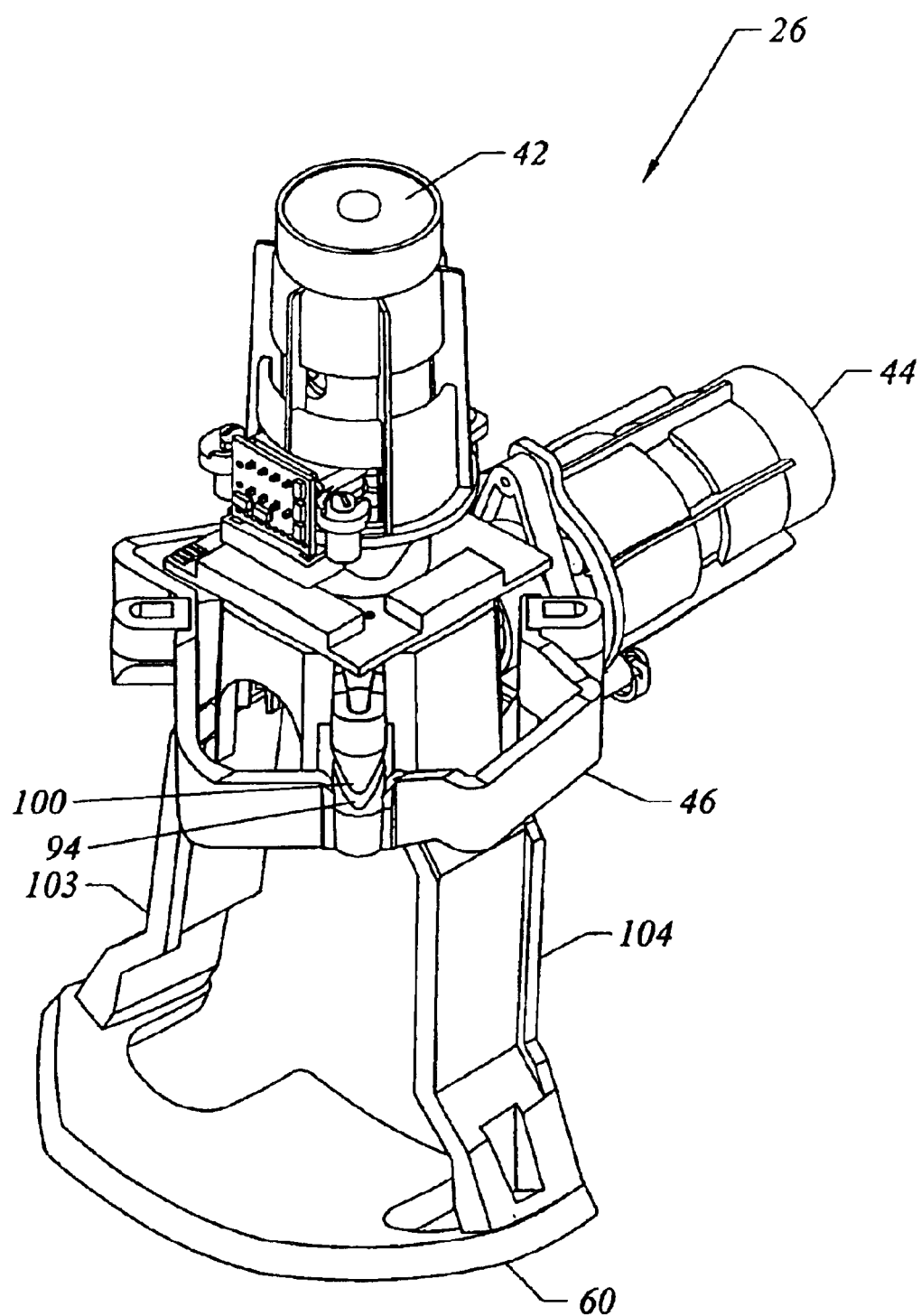
FIGS. 5a–5d depict a course pendulum in the dual pendulum assembly in FIGS. 4a–4d.
Figure 5B:
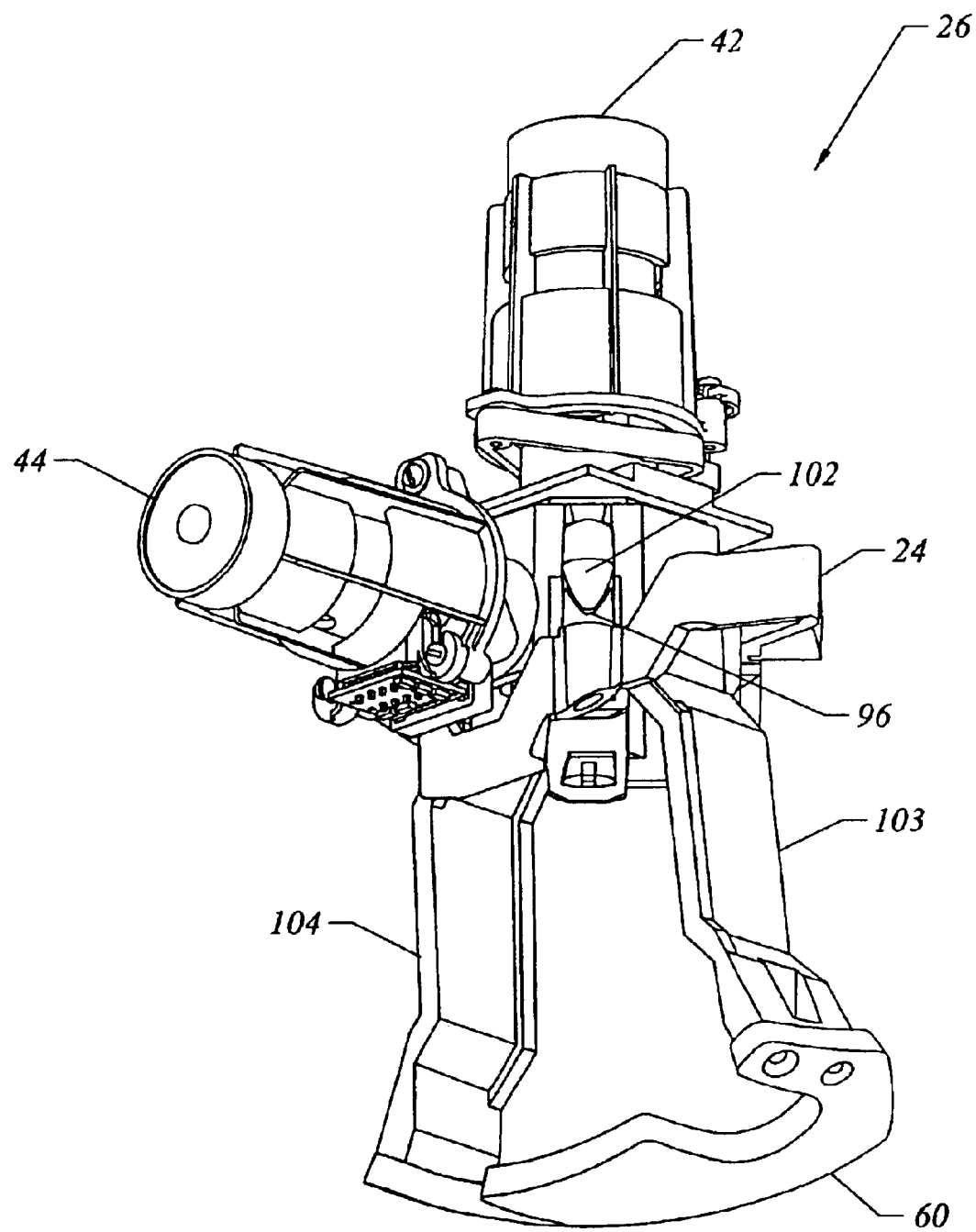
Figure 5C:
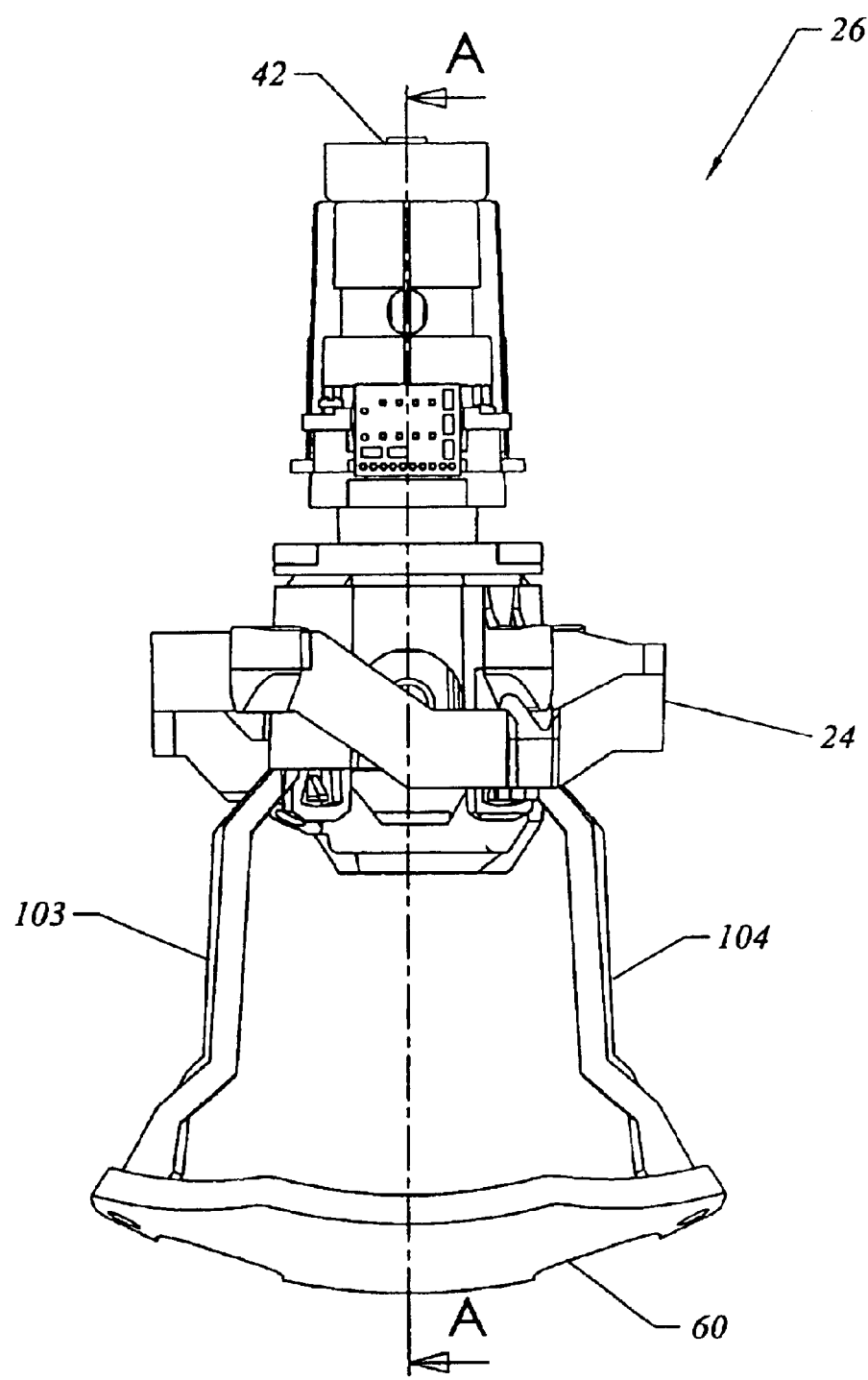
Figure 5D:
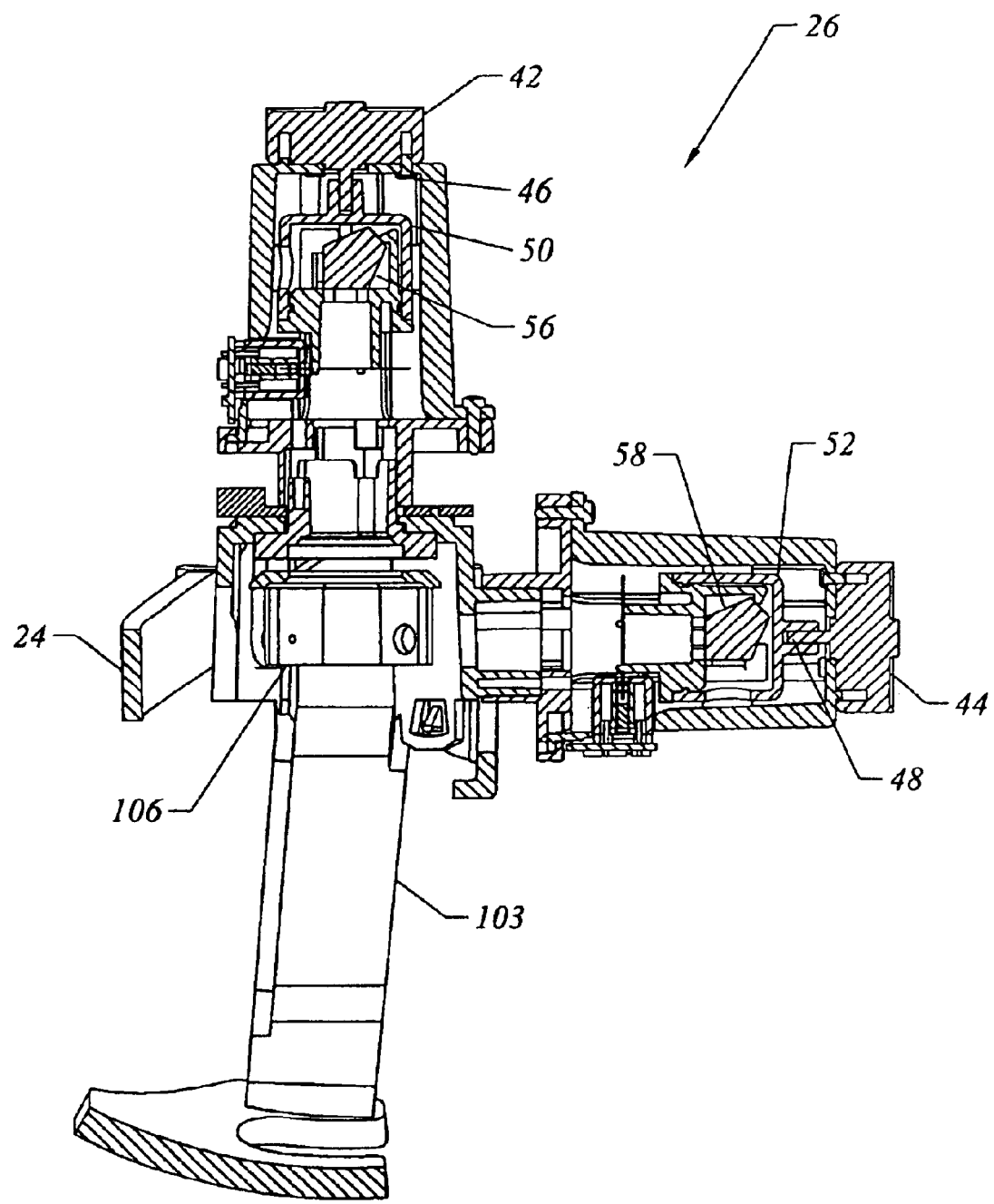
Figure 6A:
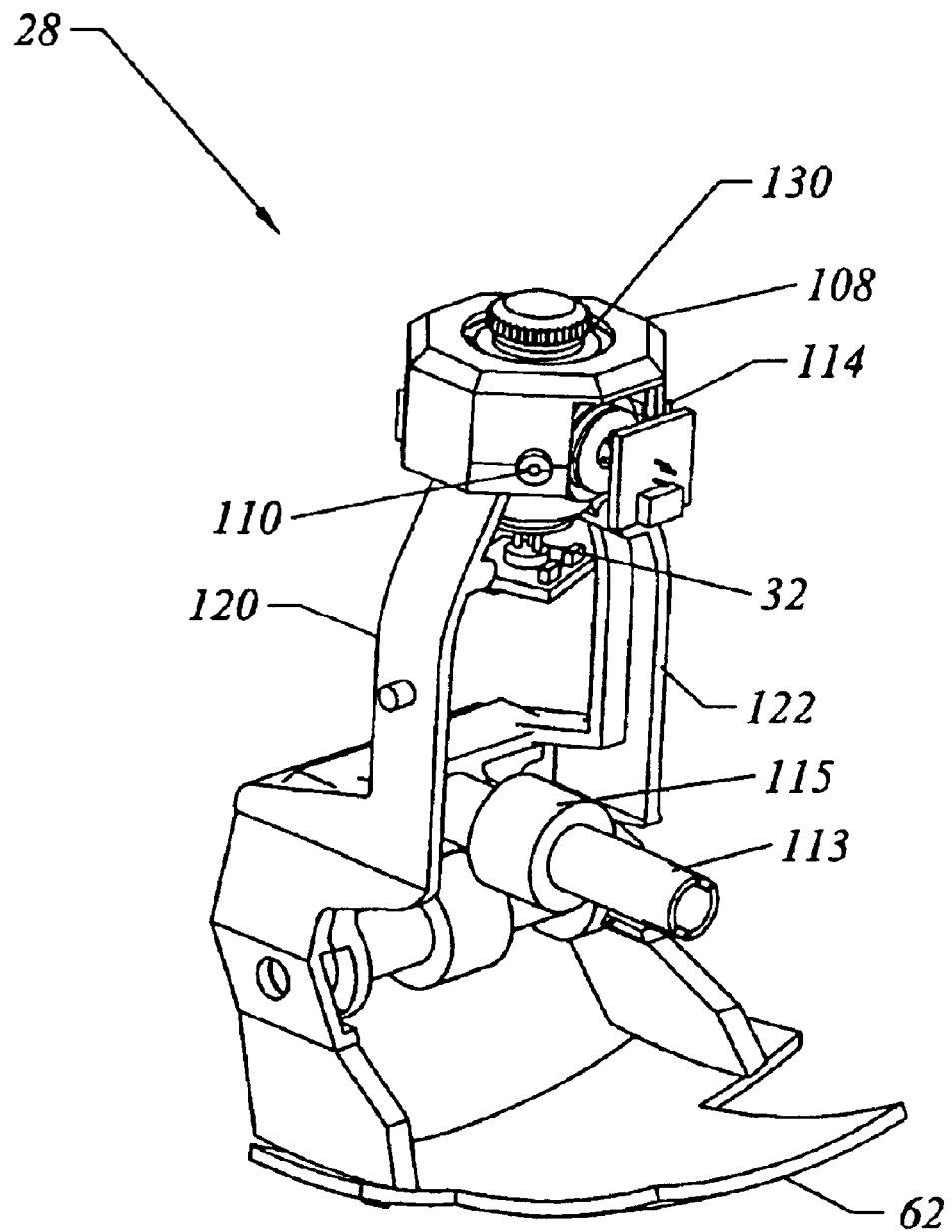
FIGS. 6a–6d depict a fine pendulum in the dual pendulum assembly in FIGS. 4a–4d.
Figure 6B:
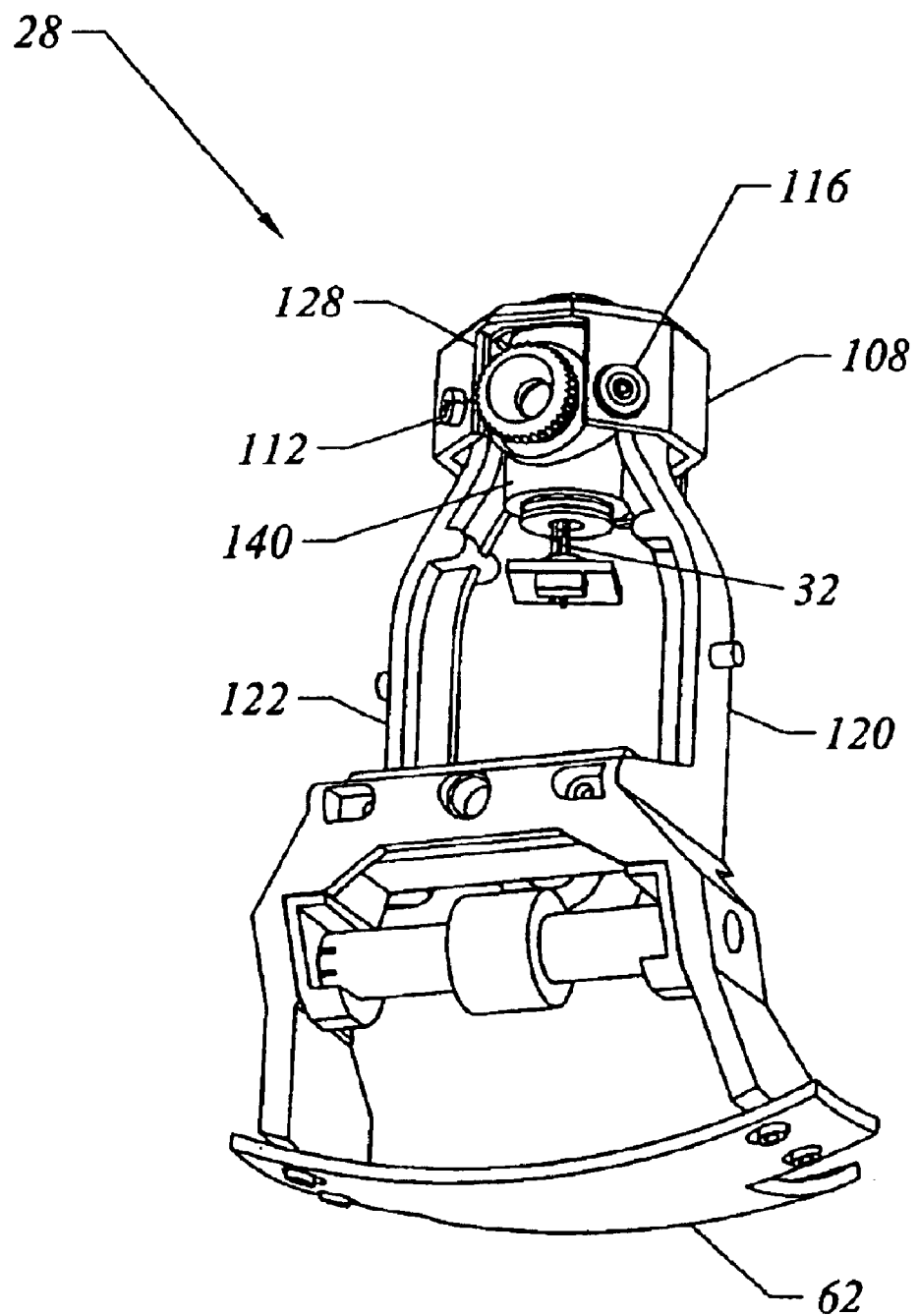
Figure 6C:
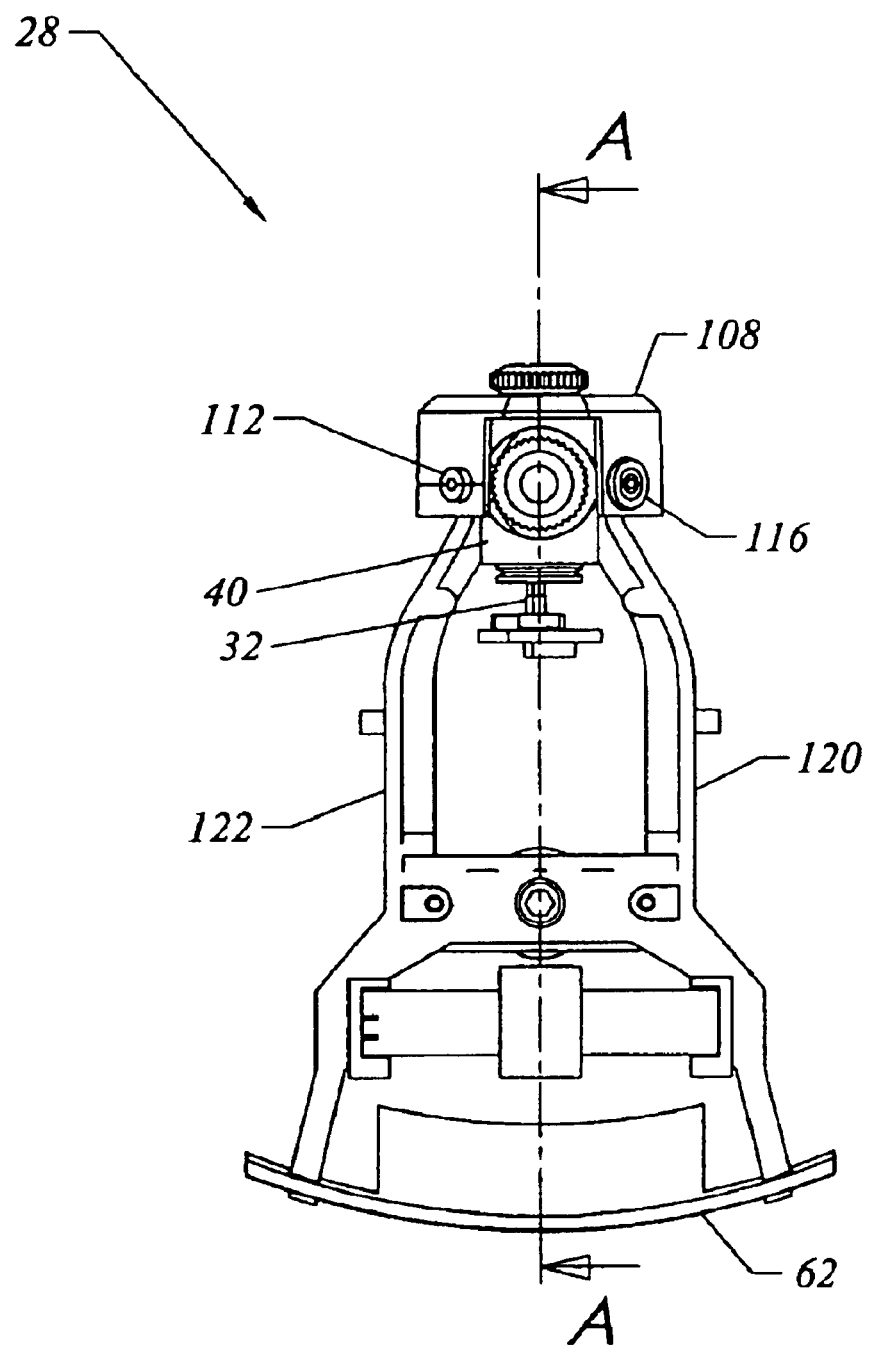
Figure 6D:
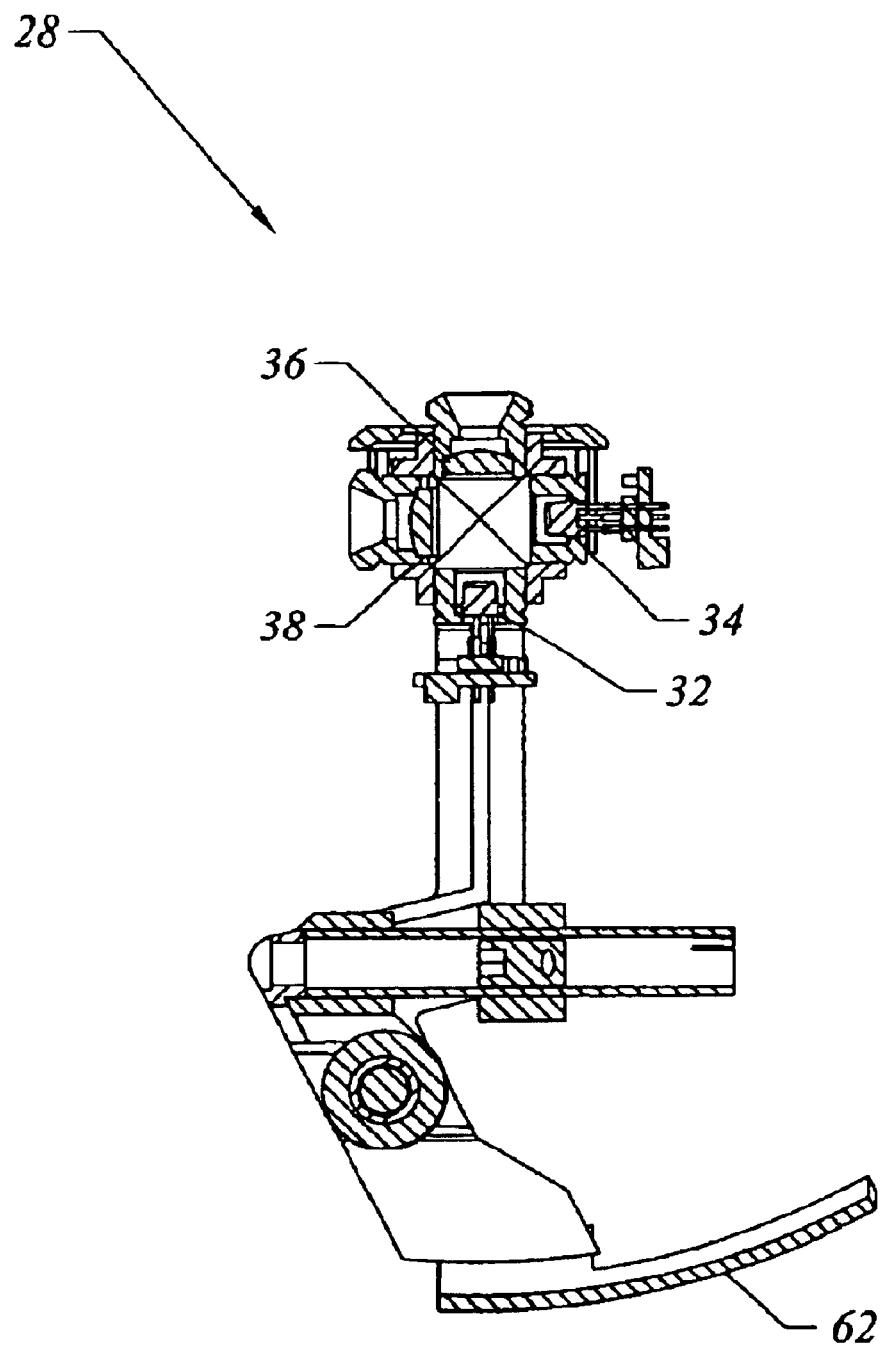

As shown in FIG. 5d, coarse pendulum 26 includes fine pendulum gimbal ring 106. FIGS. 6a and 6b show corresponding gimbal ring 108 on small pendulum 28. Gimbal ring 108 includes rods 110 and 112, which are rigidly mounted within corresponding holes (not shown) in gimbal ring 106 of coarse pendulum 26.

FIGS. 6a and 6b also show mounting posts 114 and 116 extending through gimbal ring 108. Posts 114 and 116 secure fine pendulum arms 122 and 120, respectively, to gimbal ring 108. Posts 114 and 116 secure arms 122 and 120 so that fine pendulum 28 swings within coarse pendulum 26 along an imaginary axis extending between posts 114 and 116. In one implementation, coarse pendulum 26 and fine pendulum 28 are aligned so their respective swing axes are perpendicular to each other. Additionally, the pendulums' swing axes go through a point of coincidence with the beams from laser beam source assembly 30.

Gimbal ring 108 on small pendulum 28 (FIGS. 6a and 6b) also supports laser beam mounting block 40, which houses diodes 32 and 34 and lenses 36 and 38. Gimbal ring 108 has openings 128 and 130 to pass beams from diodes 34 and 32, respectively. Gimbal ring 106 has corresponding openings (not shown). Gimbal ring 108 is aligned within gimbal ring 106 in coarse pendulum 26, so that a beam passing through opening 128 is incident in penta-prism 58 and a beam passing through opening 130 is incident on penta-prism 56.

Fine pendulum 28 also includes a mechanism for adjusting the center of gravity for pendulum assembly 20. Member 113 is mounted to pendulum arms 120 and 122. Member 113 is tubular with external and internal surfaces that are threaded. Weight 115 has an internal threaded surface and is positioned on member 113. A set screw (not shown) is positioned inside member 113. Adjusting the position of weight 115 and the set screw shift the center of gravity for pendulum assembly 20. Adjusting the set screw provides fine adjustments, while adjusting weight 115 provides course adjustments.

IV. Laser Beam Source Assembly

Figure 7:
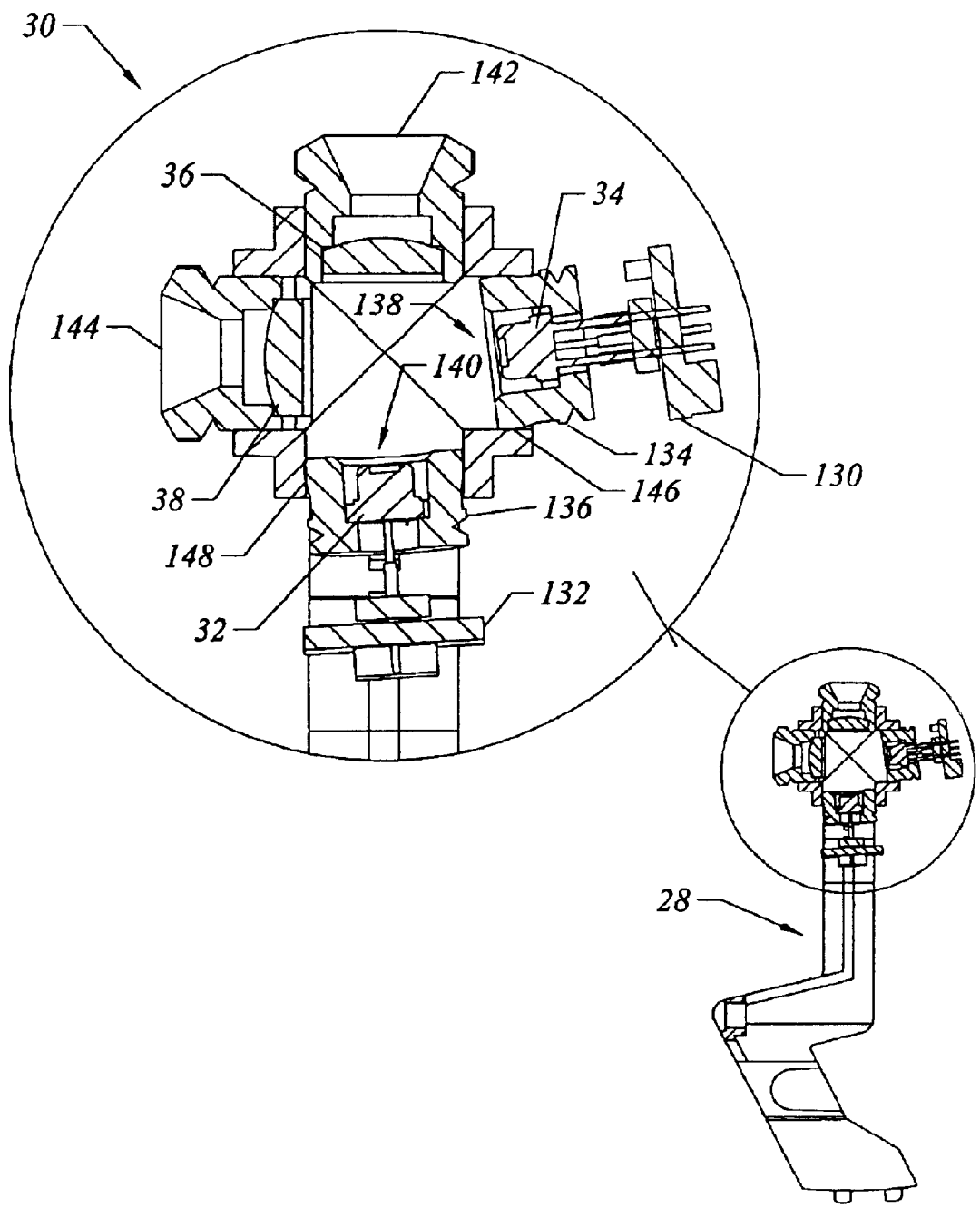
FIG. 7 illustrates a laser beam source assembly for use in one version of the present invention.
Figures 8A, 8B, 8C:
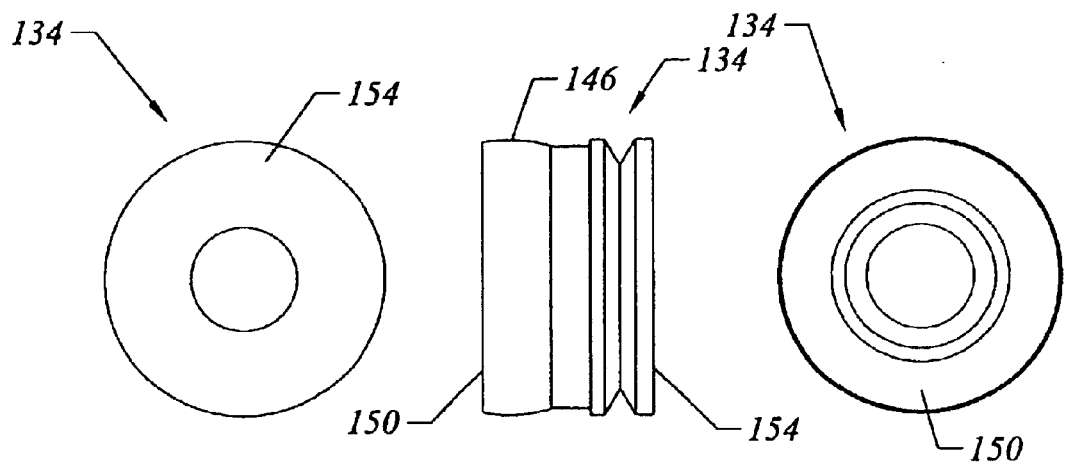
FIGS. 8a–8e illustrate a spherical laser diode mounting joint for use in embodiments of the present invention.
Figures 8D, 8E:
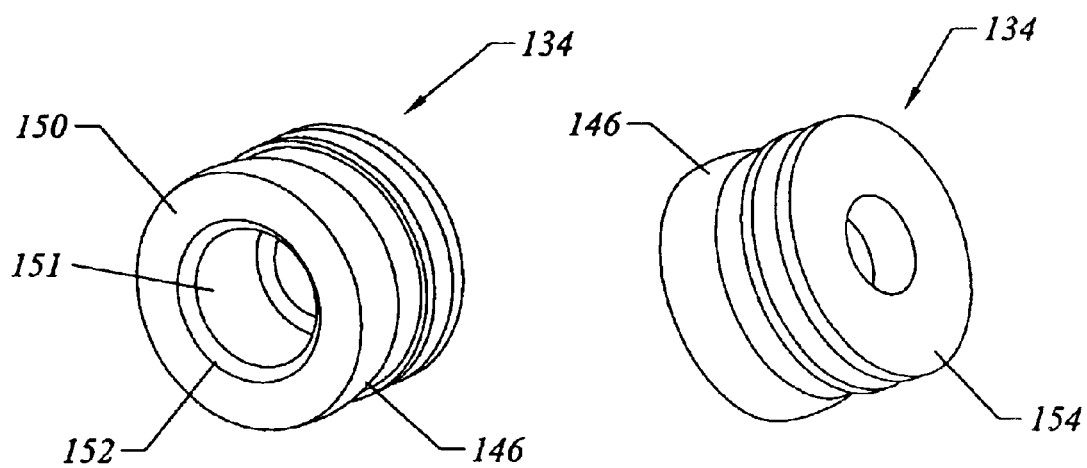

FIG. 7 shows a magnified cross-sectional view of laser beam source assembly 30. Mounting block 40 includes cylindrical openings 138 and 140 for receiving and holding laser diodes 34 and 32, respectively. Collimating lens 38 is mounted directly across from opening 138, and collimating lens 36 is mounted directly across from opening 140. Collimating beams from lenses 38 and 36 exit assembly 30 through exits 144 and 142, respectively.

In one embodiment, lenses 38 and 36 are mounted so their centers are offset from the center of the beams produced by diodes 34 and 32, respectively. In such an embodiment, lenses 38 and 36 are mounted to rotate about an axis passing through the center of the beams from diodes 34 and 32, respectively. This allows the positions of lenses 38 and 36 to be adjusted to bring the beams from diodes 34 and 32 into an orthogonal relationship.

Laser diodes 32 and 34 are coupled to circuit boards 132 and 130, respectively, to receive power. Spherical mounting joint 134 holds laser diode 34 for placement in opening 138. Spherical mounting joint 136 holds laser diode 32 for placement in opening 140. Spherical mounting joints 134 and 136 are press fit into openings 138 and 140, respectively. Spherical mounting joints 134 and 136 have a spherical surface on front sections 146 and 148, which are inserted into openings 138 and 140. Spherical sections 146 and 148 allow manufacturers to tilt mounting joints 134 and 136 within openings 138 and 140. In alternate implementations, sections 146 and 148 have rounded surfaces that may not be a perfect cross-section from a sphere.

The ability to tilt joints 134 and 136 provides greater flexibility in aligning diodes 32 and 34 with lenses 36 and 38, respectively. Manufacturers press fit and adjust mounting joints 134 and 136 so the beams from diodes 34 and 32 are perpendicular after passing through collimating lenses 38 and 36, respectively. In some implementations, manufacturers apply glue or epoxy to further secure the positioning of joints 134 and 136.

FIGS. 8a–8e show spherical mounting joint 134 and apply equally to joint 136. Spherical mounting joint 134 includes spherical front section 146 for press fitting into a mounting block opening. In one version, front section 146 has a rounded surface that spherically curves as the surface extends away from face 150. Chamfer 152 extends from face 150 to inner surface 151 of joint 134. Chamfer 152 acts as a guide for press fitting diode 34 into joint 134. Diode 34 is press fit into joint 134 so that the diode's beam is coincident with the center of the sphere of which section 146 is a portion. Face 154 contains an opening for allowing the electrical leads from a laser diode to exit joint 134.

In one version, joint 134 has a press fit interference of 0.001 to 0.003 inch with mounting block opening 138.

Figure 9:
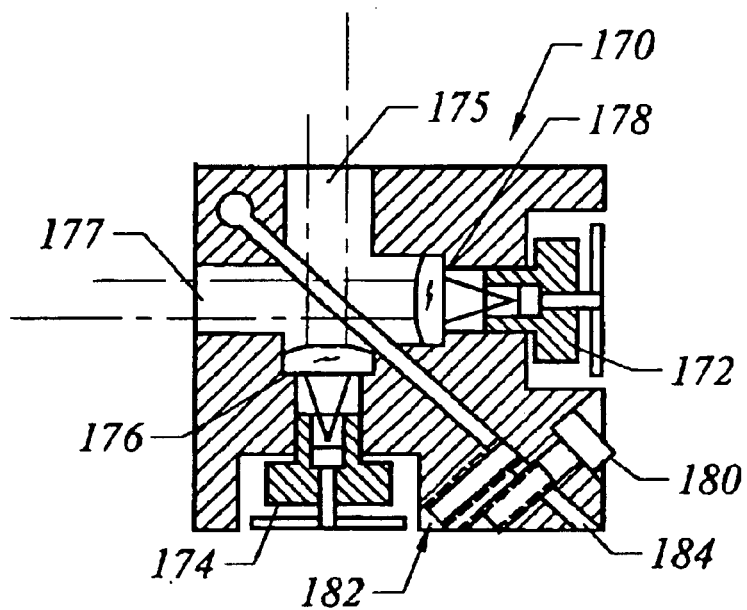
FIG. 9 illustrates an alternate laser beam source assembly.

FIG. 9 shows a cross sectional view of an alternate version of laser beam source assembly 30. The laser beam source assembly in FIG. 9 uses laser diodes 172 and 174 to generate horizontal and vertical laser beams. Split-block flexure 170 includes hollow channels 175 and 177, which are orthogonal to each other. Laser diode 172 is mounted at one end of channel 177 along with collimating lens 178. The laser beam from diode 172 passes through collimating lens 78 and exits block 70 as a collimated beam through channel 177. Laser diode 174 is mounted at one end of channel 175 along with collimating lens 176. The laser beam from diode 174 passes through collimating lens 176 and exits block 170 as a collimated beam through channel 175.

In order to ensure that the horizontal and vertical beams are perpendicular to each other, block 170 includes adjustment screws 180 and 182. Block 170 is made of aluminum, plastic, or any other strong, yet moderately flexible material. Block 170 is substantially split along diagonal 184—providing a small degree of play between the opposing sides. Screw 180 extends into the portion of block 170 housing diode 174 from the side of block 170 housing diode 172 and through the split along diagonal 184. Screw 182 extends into the portion of block 170 housing diode 172 from the side of block 170 housing diode 174 and through the split along diagonal 184. Screws 180 and 182 hold block 170 together in a rigid position. The positions of diodes 172 and 174 are adjusted to ensure their orthogonal relationship to each other by tightening or loosening screws 180 and 182.

Figure 10:
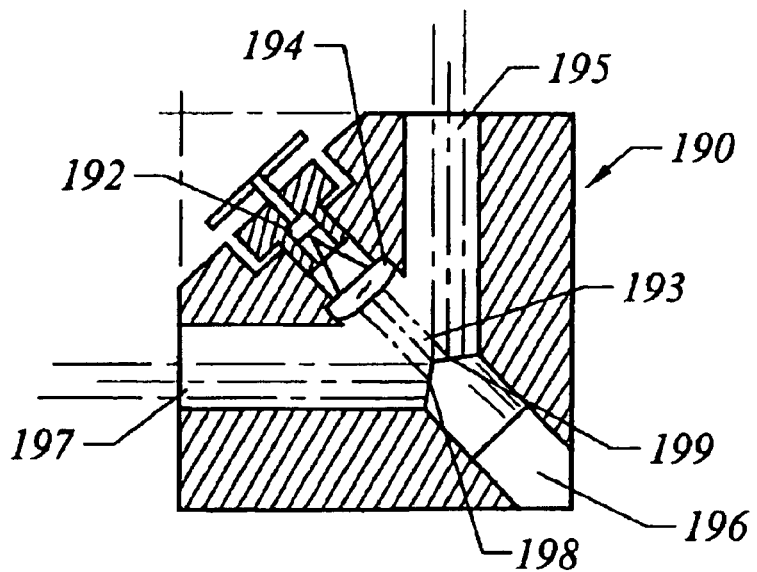
FIG. 10 illustrates another laser beam source assembly.

FIG. 10 shows a cross-sectional view of a yet another version of laser beam source assembly 30. The laser beam source assembly in FIG. 10 divides the beam from a single laser diode to generate two orthogonal laser beams. Block 190 includes channel 193 extending along the diagonal of block 190. Laser diode 192 is mounted at one end of channel 193. Collimating lens 194 is mounted in channel 193 in front of diode 192. Beam dividing mechanism 196 is mounted in channel 193 to receive a collimated beam from diode 192 through lens 194.

In one embodiment of the present invention, beam dividing mechanism 196 is a bi-mirror machined from aluminum or a similar reflective surface. Bi-mirror surfaces 198 and 199 each present an angle to the collimated beam from diode 192 and lens 194. The angles of surfaces 198 and 199 are set so that bi-mirror 196 splits the incoming beam into two perpendicular beams.

Block 190 also includes channels 195 and 197—each extending from a respective face of bi-mirror 196 to the exterior of block 190. Channels 195 and 197 are formed to be perpendicular to each other. As a result, resulting orthogonal beams from bi-mirror 196 pass through channels 195 and 197 to form horizontal and vertical beams.

In alternate embodiments of the laser beam source assembly shown in FIG. 10, different mechanisms can be employed to divide the beam from laser diode 192. For example, a pair of mirrors or beam-splitters can replace bi-mirror 196. The mirrors or splitters are aligned orthogonal with each other to form a knife-edge, with each surface at a 45-degree angle to the incoming collimated beam. In another implementation, a single laser diode directs a beam onto a beam splitter to create two orthogonal beams.

V. Laser Beam Reflection

Figure 11:
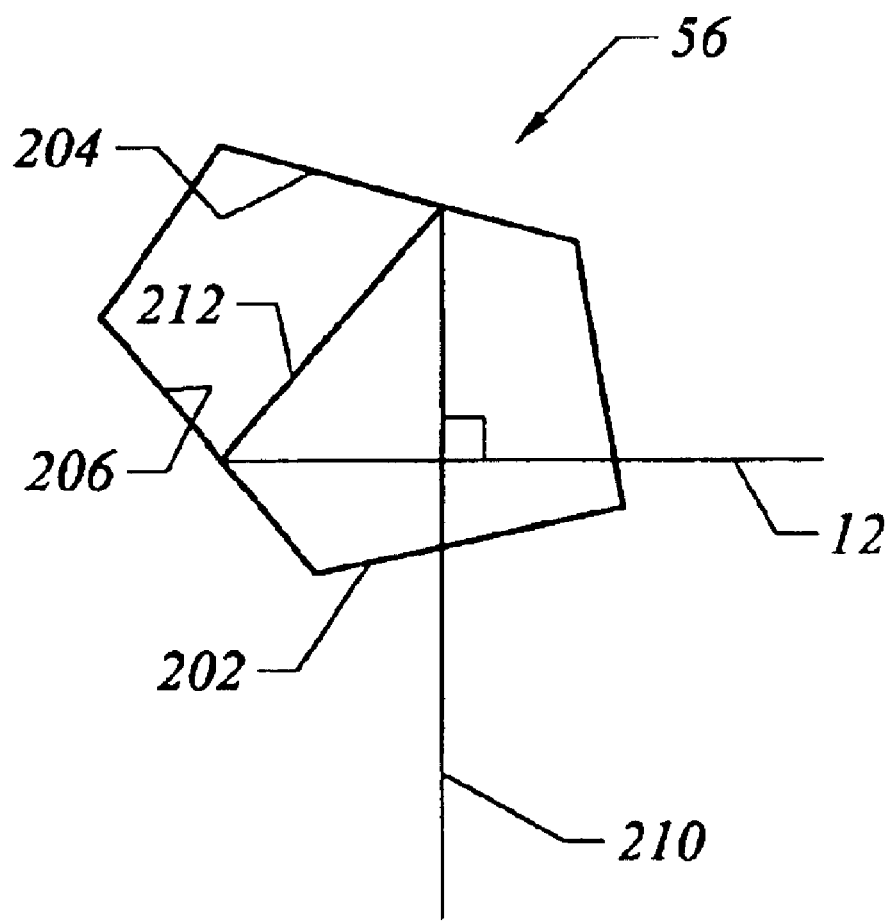
FIG. 11 shows a penta-prism for use in the laser alignment device shown in FIGS. 2a–2f.

FIG. 11 illustrates a five-sided prism that can be employed to operate as penta-prisms 56 and 58. FIG. 11 is described with reference to penta-prism 56, but the description is equally applicable to penta-prism 58. Penta-prism 56 produces an output beam perpendicular to a beam entering through input side 202. In operation, beam 210 enters penta-prism 56 through side 202 and is reflected by mirrored surface 204 to produce reflected beam 212. Mirrored surface 206 reflects beam 212 to create perpendicular horizontal output beam 12.

In an alternate version of penta-prism 56, surface 204 is a beam splitter that reflects and transmits beam 210, and a wedge of glass is mounted on the outside of beam splitter 204. As a result, a plumb beam is generated along with horizontal output beam 12. In a further modification, penta-prism 56 is mounted so that it can be rotated out of the path of beam 210—allowing a plumb beam output to be generated. In other implementations, penta-prisms 56 and 58 are each replaced by a single mirror or set of mirrors for bending beam 210.

VI. Alignment Device Control Subsystem

A. Architectural Overview

Figure 12:
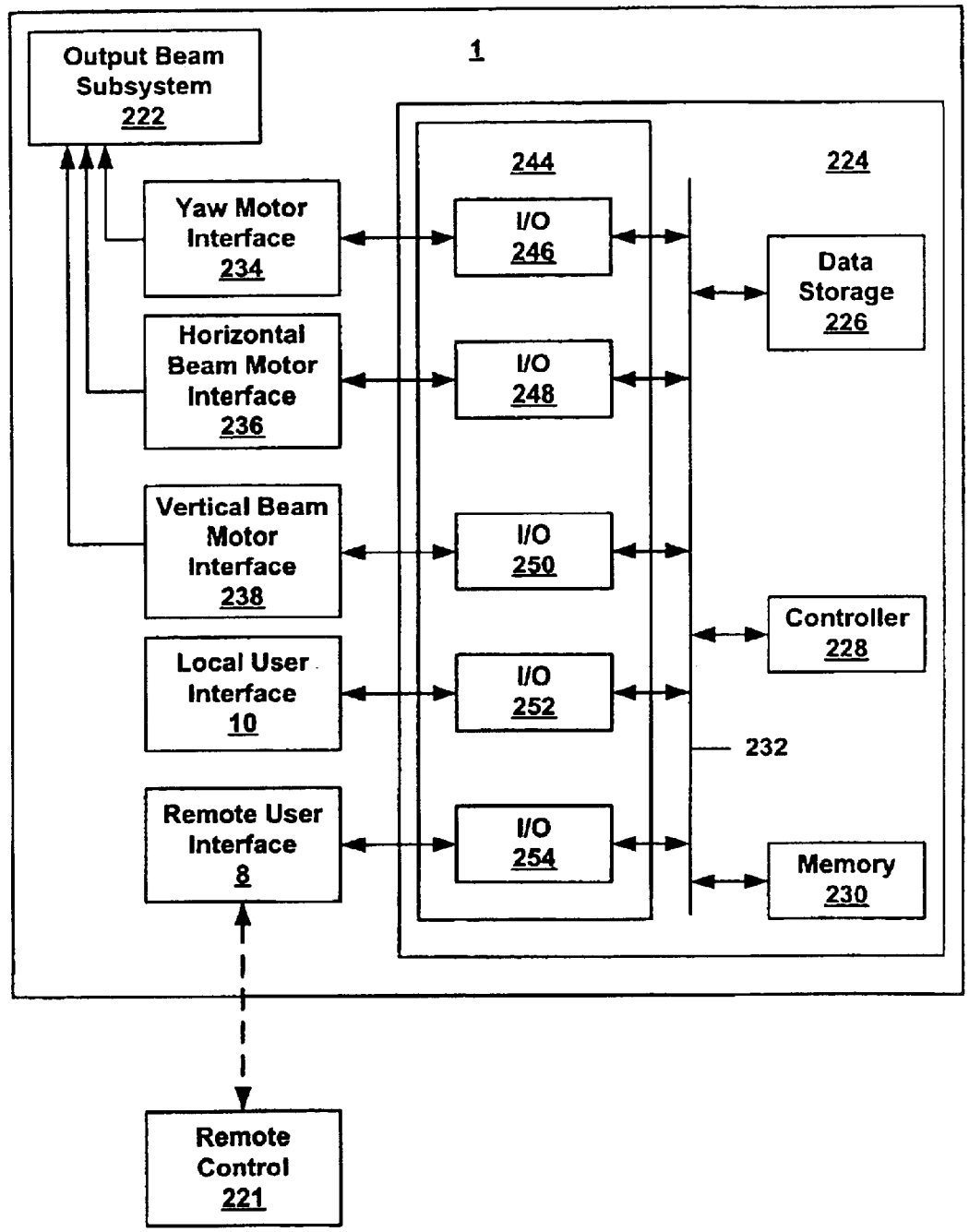
FIG. 12 is a block diagram of a laser alignment device in accordance with the present invention.

FIG. 12 is a block diagram of laser alignment device 1—including control subsystem 224, output beam subsystem 222, yaw motor interface 234, horizontal beam motor interface 236, vertical beam motor interface 238, local user interface 10, and remote user interface 220.

Output beam subsystem 222 includes the components described above with reference to FIGS. 2a–2f for providing references from vertical output beam 14 and horizontal output beam 12. As explained above, output beam subsystem 222 includes horizontal beam motor 43, vertical beam motor 44, and yaw motor 80.

Control subsystem 224 controls user interfaces to laser alignment device 1 and the operation of motors in output beam subsystem 222. Control subsystem 224 includes bus 232 coupling controller 228, data storage unit 226, memory 230, and input/output block 244. Controller 228 is a central processing unit used for executing program code instructions, such as a microprocessor or mircocontroller. In response to program code instructions, controller 228 retrieves and processes data and provides data and control signals. Input/output block 244, data storage unit 226 and memory 230 are all coupled to bus 232 to exchange data and control signals with controller 228.

Memory 230 stores, in part, data and instructions for execution by controller 228. If a process is wholly or partially implemented in software, memory 230 may store the executable instructions for implementing the process when laser alignment device 1 is in operation. Memory 230 may include banks of dynamic random access memory, static random access memory, read-only memory and other well known memory components Data storage unit 226 provides non-volatile storage for data and instructions for use by controller 228. In software embodiments of the present invention, data storage unit 226 may store instructions executed by controller 228 to perform processes. Data storage unit 226 may support portable storage mediums, fixed storage mediums or both Data storage unit 226 implements fixed storage mediums using a magnetic disk drive or an optical disk drive. Data storage unit 226 supports portable storage mediums by providing a portable storage medium drive that operates in conjunction with portable non-volatile storage mediums— enabling the input and output of data and code to and from control subsystem 224. Examples of portable storage mediums include floppy disks, compact disc read only memory, or an integrated circuit non-volatile memory adapter (i.e. PC-MCIA adapter). In one embodiment, instructions for enabling control subsystem 224 to execute processes are stored on a portable medium and input to control subsystem 224 via a portable storage medium drive.

For purposes of simplicity, all components in control subsystem 224 are shown as being connected via bus 232. Control subsystem 224, however, may be connected through one or more data transport mechanisms. For example, controller 228 and memory 230 may be connected via a local microprocessor bus, and data storage unit 226 and input/output block 244 may be connected via one or more input/output (I/O) busses.

Input/output ports 246, 248, and 250 in input/output block 244 couple bus 232 to yaw motor interface 234, horizontal beam motor interface 236, and vertical beam motor interface 238, respectively. Yaw motor interface 234 is coupled to yaw motor 80 in output beam subsystem 222. Horizontal beam motor interface 236 is coupled to horizontal beam motor 42 in output beam subsystem 222. Vertical beam motor interface 238 is coupled to vertical beam motor 44 in output beam subsystem 222. Motor interfaces 234, 236, and 238 provide conversions between the digital data and control signaling of control subsystem 224 and the analog signaling of the motors in output beam subsystem 222.

Input/output ports 252 and 254 in input/output block 244 couple bus 232 to user interfaces 10 and 8. Input/output port 252 is coupled to local user interface 10. Input/output port 256 is coupled to remote user interface 8. Local user interface 10 provides a portion of the user interface for a user of laser alignment device 1 to control the operation of device 1. In different implementations, local user interface 10 may include an alphanumeric keypad or cursor control device, such as a mouse, trackball, stylus, or cursor direction keys. Information provided by the user through local user interface 10 is provided to controller 228 through input/output port 252.

Remote user interface 8 enables a user to communicate with laser alignment device 1 using remote control 221— allowing the user to provide instructions. Remote user interface 8 supports the protocol required for facilitating a communications link with remote control 221—providing conversions between the digital signaling of control subsystem 224 and the signaling of remote control 221. For example, one type of remote control communicates with remote user interface 8 through a radio frequency connection. Another type of remote control communicates with remote user interface 8 via an infrared signaling connection.

U.S. Pat. Nos. 5,680,208 and 5,903,345 provide examples of remote controls and remote control interfaces that can be used with alignment device 1. U.S. Pat. Nos. 5,680,208 and 5,903,345 are hereby incorporated by reference.

In addition to the above-described components, control subsystem 224 may include a display system and a communications controller. A display system enables laser alignment device 1 to display textual and graphical information. The display system may include a cathode ray tube (CRT) display or liquid crystal display (LCD). The display system would receive textual and graphical information from controller 228 through input/output block 244. Potential communications controllers include network interface cards or integrated circuits for interfacing alignment device 1 to a communications network. Instructions for enabling control subsystem 224 to perform processes may be down loaded into memory 230 over the communications network.

Those skilled in the art will recognize that FIG. 12 only shows one embodiment of control subsystem 224 and that numerous variations of control subsystem 224 fall within the scope of the present invention. The components contained in control subsystem 224 are those typically found in general purpose computer systems, and in fact, these components are intended to represent a broad category of such computer components that are well known in the art.

B. Positioning Horizontal References

Operators select the location of horizontal reference lines and points by providing a location input through remote control 221 or local user interface 10—causing horizontal beam motor 42 to rotate penta-prism 56 into a desired position for a reference point or line. Laser alignment device 1 includes a motor control mechanism that enables operators to accurately position horizontal beam motor 42 when selecting reference line and point locations. In one implementation, motor 42 is a direct drive motor, such as the motors used in compact disc players.

Figure 13A:
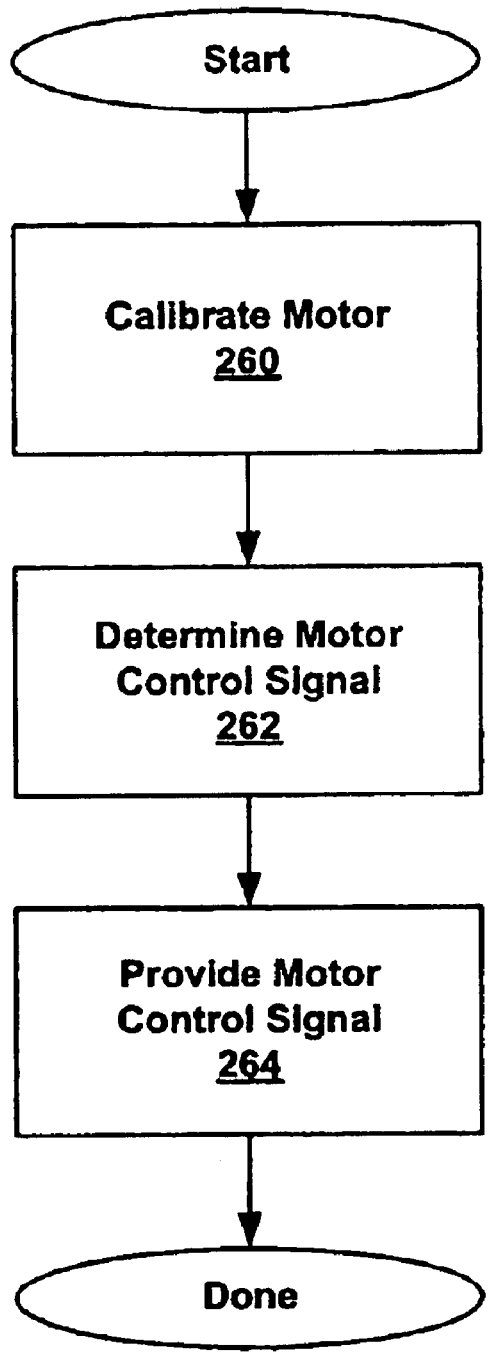
FIG. 13a shows a series of steps for positioning horizontal and vertical references.

FIG. 13a shows a process employed by laser alignment device 1 to position horizontal beam motor 42. Device 1 controls horizontal beam motor 42 by providing a control signal. The pulse width and frequency of the control signal determine the magnitude of rotation of horizontal beam motor 42. Horizontal beam motor 42 is first calibrated to identify an ideal pulse width for use in positioning motor 42 (step 260). Next, device 1 determines the motor control signal necessary for positioning motor 42 to a desired position (step 262) and provides the signal to motor 42 (step 264).

Figure 13B:
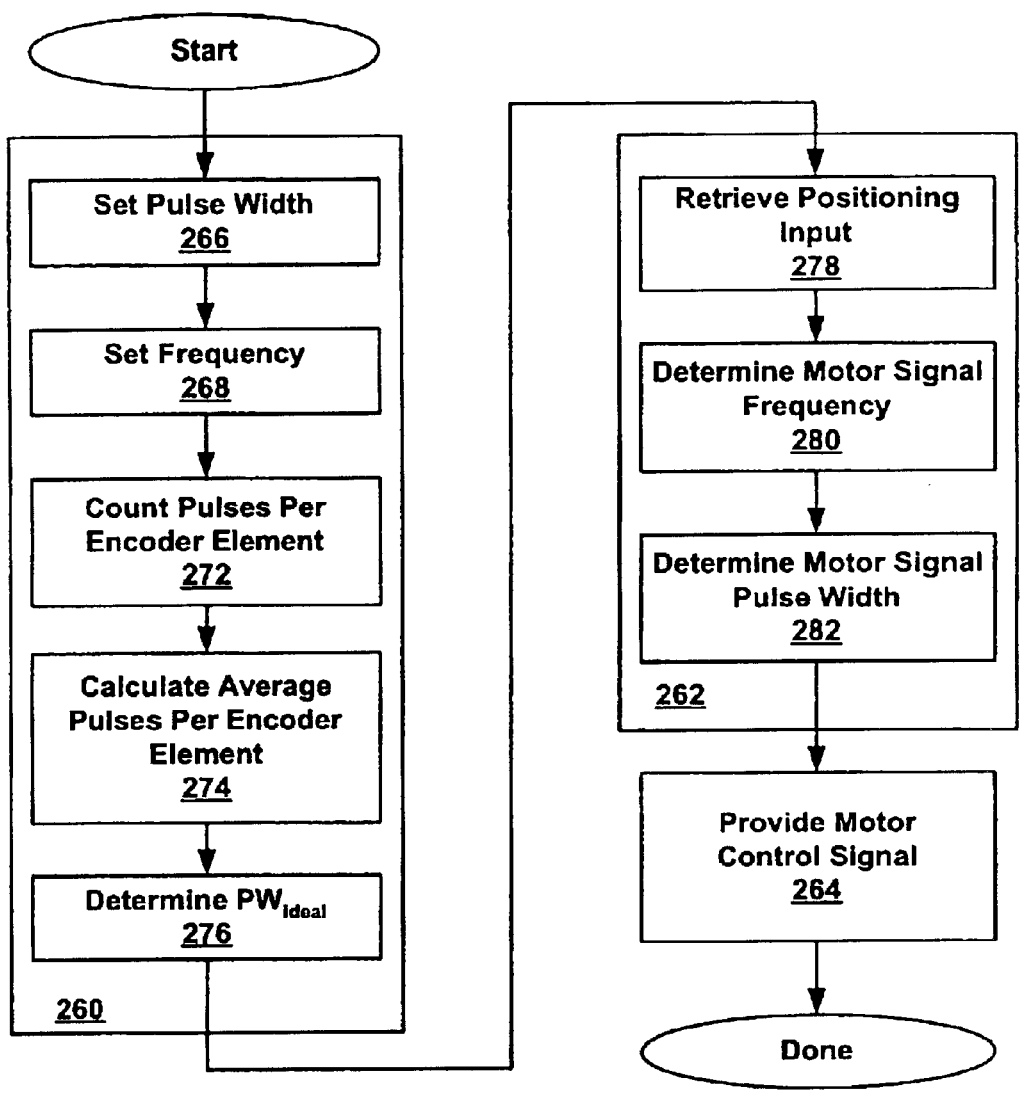
FIG. 13b shows a more detailed series of steps for positioning horizontal and vertical references.

FIG. 13b provides a more detailed view of the process shown in FIG. 13a. In the calibration process, the motor control signal pulse width and frequency are set to predetermined values, such as 1,000 microseconds and 200 hertz (steps 266 and 268, respectively). An encoder is coupled to motor 42 in the calibration process. The encoder includes alternating transparent and blacked-out elements. In one embodiment, each element represents one degree of a 360-degree circular encoder. The motor is rotated a predetermined number of degrees—90 degrees in one implementation. Device 1 records the number of pulses required to move through each encoder element during the rotation (step 272). Device 1 then calculates the average number of pulses required to pass through an encoder element (step 274).

Figure 14:
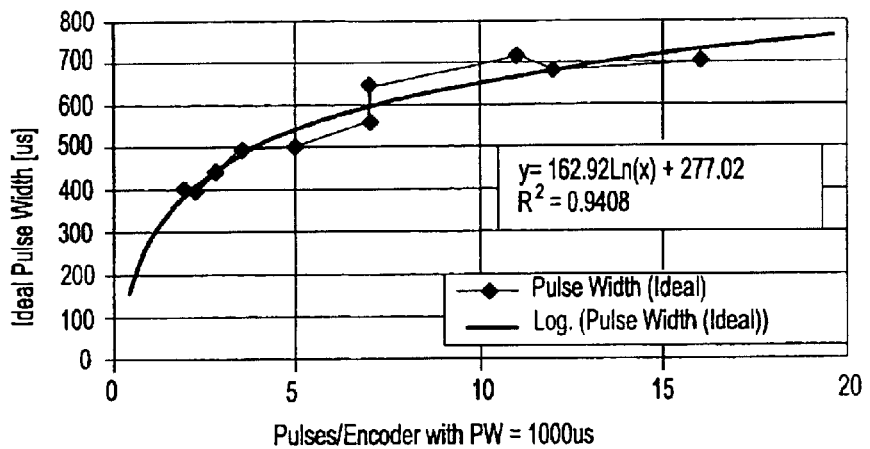
FIG. 14 is a graph representing a pulse width lookup table used during a calibration operation in the reference positioning process in FIGS. 13a and 13b.

Next, device 1 determines the ideal pulse width ($PW_{ideal}$), based on the average number of pulses per encoder element (step 276). FIG. 14 shows a graphical representation of a lookup table employed in one version of device 1 to determine the ideal pulse width. Device 1 identifies the ideal pulse width in the lookup table that corresponds to the average number of pulses per encoder calculated in step 274. In one version of the lookup table, the values for the ideal pulse width are rounded to the nearest 25 microseconds and the values for the average number of pulses per encoder has a range from 2 to 20.

The above-described calibration process can be performed either during the manufacturing process for laser alignment device 1 or as part of normal device operation.

After calibration, device 1 retrieves a positioning input for horizontal beam motor 42 (step 278)—indicating the distance motor 42 is to be rotated. One method of obtaining this input is determining the time period that an operator presses a button on remote control 221 or local user interface 10. Device 1 employs the positioning input to determine the frequency (step 280) and pulse width (step 282) for the motor control signal.

Figure 15A:
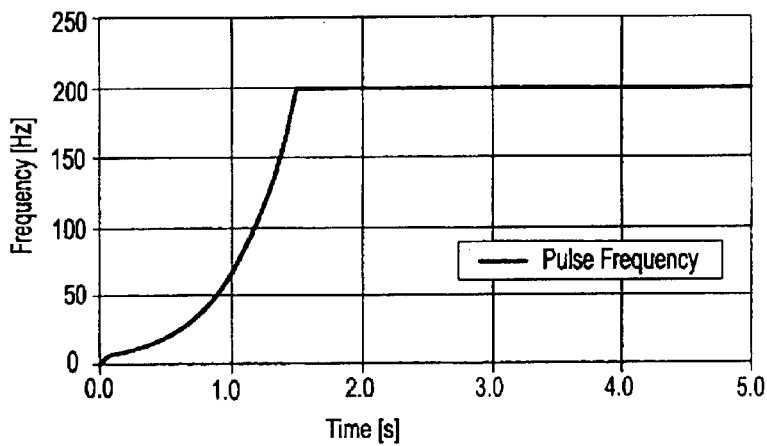
FIGS. 15a and 15b are graphical representations of characteristic frequency and pulse width lookup tables used in the reference positioning process in FIGS. 13a and 13b.

In one implementation of device 1, the pulse width and frequency are obtained from lookup tables characterizing horizontal beam motor 42. FIG. 15a depict a graphical representation of a frequency lookup table for motor 42. The frequency values are obtained, based on the following equation:

$$\text{Frequency} = \text{Minimum}([K_0 * 10^T], [f_{max}])$$

wherein:

Frequency is the motor control signal frequency.

Minimum( ) means the minimum value between the parentheses.

$K_0 = 10^{Log(fmax) - IC1}$ $f_{max}$ is the maximum motor control signal frequency.

$IC_1$ is the time at which $f_{max}$ occurs.

T is the time duration the operator provides the positioning input.

Figure 15B:
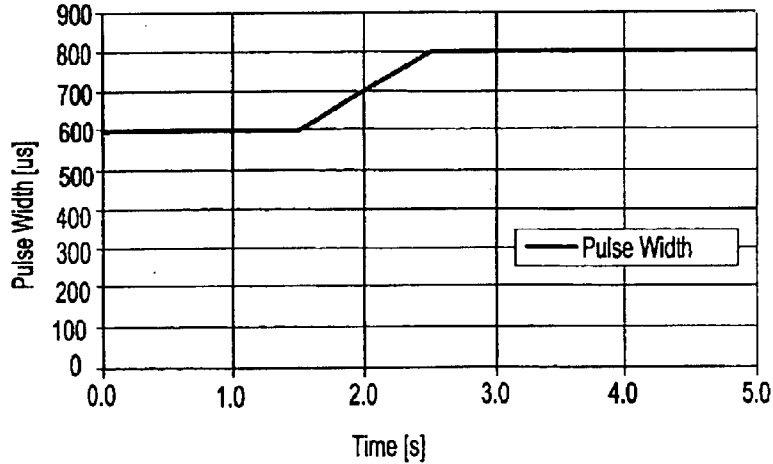

FIG. 15b depicts a graphical representation of a pulse width lookup table for motor 42. The pulse width values are obtained, based on the following equation:

If T is less than or equal to $IC_1$: $PW = PW_{ideal}$

If T is greater than $IC_1$: $PW = \text{Minimum}([\text{Slope}*(T-IC_1) + PW_{ideal}], [PW_{max}])$ wherein:

PW is the motor control signal pulse width.

$\text{Slope} = (PW_{max} - PW_{ideal})/(IC_2 - IC_1)$ $PW_{max}$ is the maximum motor control signal pulse width.

$IC_2$ is the time at which $PW_{max}$ occurs.

In an alternate embodiment, alignment device 1 calculates the motor signal frequency and pulse width in real-time, instead of using lookup tables.

In one version of device 1, the process in FIGS. 13a and 13b is implemented as program code for execution by control subsystem 224. In an alternate embodiment, device 1 implements the process described in FIGS. 13a and 13b in hardware components.

In further implementations of alignment device 1, a clutch/release mechanism holds motor 42 in place once positioning is complete. The clutch/release mechanism also provides a constant physical drag force to motor 42—swamping the variable magnetic drag of motor 42. During the positioning of reference points, the drag aids by smoothing out the number of pulses required to move through each encoder element.

Figure 16:
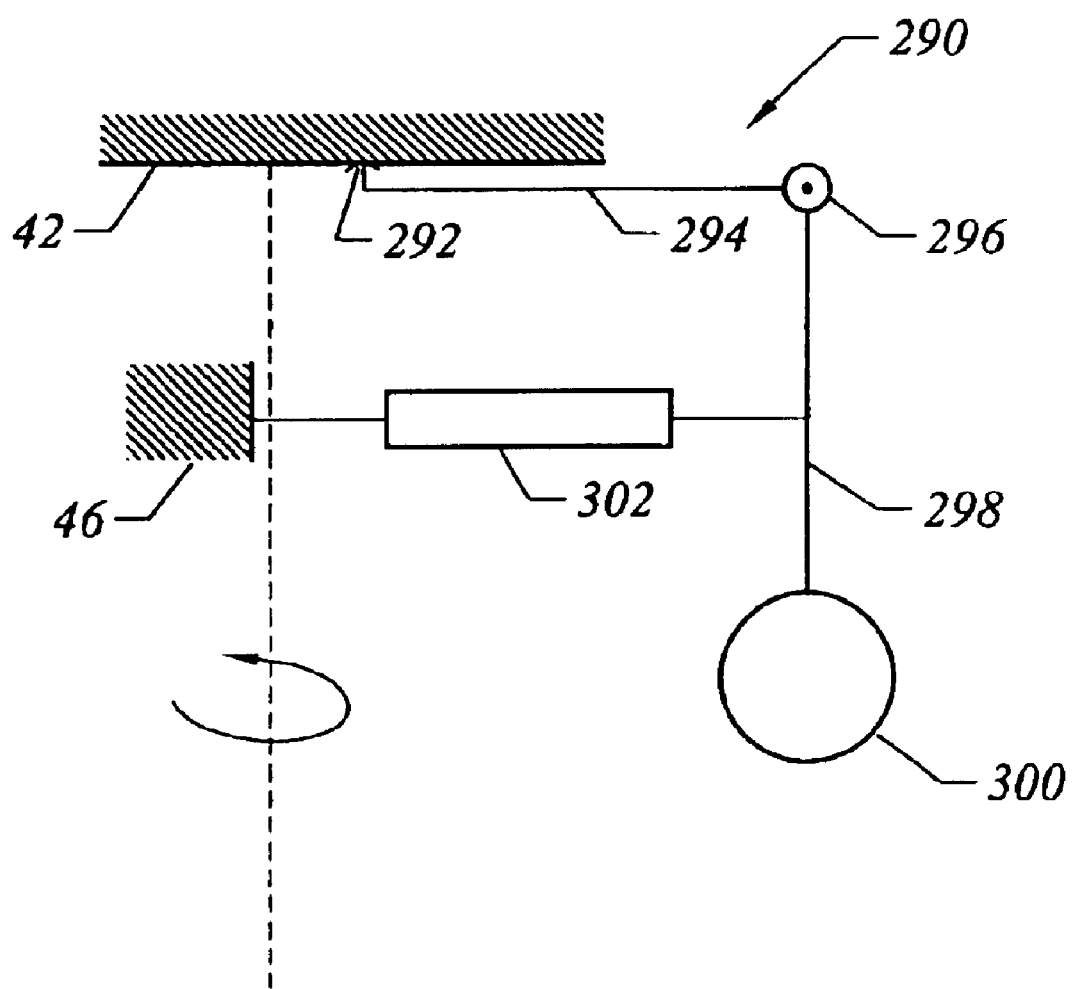
FIG. 16 depicts a clutch/release mechanism for use in one version of a laser alignment device.

FIG. 16 illustrates a schematic view of clutch/release mechanism 290 for use in alignment device 1. Clutch/release 290 is mounted to shaft 46 of motor 42 and includes friction pad 292 positioned against a rotating base of motor 42. A pivot assembly supports pad 292 and moves pad 292 away from motor 42, once the rotation of motor 42 exceeds a predetermined threshold. When pad 292 rests against the base of motor 42, the friction between pad 292 and the base of motor 42 inhibits incidental rotation of motor 42—incidental rotation can occur when laser alignment device 1 is bumped or jarred or when undesirable electromagnetic forces interfere with motor 42.

The pivot assembly supporting pad 292 includes arm 294 coupled to pivot point 296 and arm 298 coupled to pivot point 296. Arm 298 supports weight 300. Clutch/release 290 also employs spring 302, which is mounted between shaft 46 and arm 298. Spring 302 pulls arm 298 towards shaft 46—holding pad 292 against the base of motor 42. As motor 42 rotates, shaft 46 rotates—creating a centrifugal force that causes the pivot assembly to pivot about point 296. Once the rotation of shaft 46 exceeds a predetermined speed, the resulting centrifugal force pulls pad 292 completely away from motor 42. In practice, pad 292 is not in contact with motor 292 while reference planes are provided, and pad 292 is positioned to provide friction during the generation and positioning of reference lines and points.

C. Positioning Vertical References

Vertical beam motor 44 (FIGS. 2a–2f) operates in the manner described above for horizontal beam motor 42 to generate vertical reference points, lines, and planes. Vertical beam motor 44, however, cannot adjust the horizontal position of a vertical reference line. Device 1 adjusts the horizontal placement of a vertical reference line using yaw motor 80, as described above. Control subsystem 224 directs the positioning of vertical beam motor 44 and yaw motor 80 in response to user inputs from remote control 221 or local user interface 10, as described above for horizontal beam motor 44. In one embodiment, vertical beam motor 44 is also a direct drive motor like the motors used in compact disc players and is positioned using the process explained above with reference to FIGS. 13a–16.

As an alternative to yaw motor 80, some versions of laser alignment device 1 include a rotary base. In such embodiments, housing 22 is mounted to the rotary base. In response to user input from local user interface 10 or remote control 221, control subsystem 224 causes a motor in the rotary base to rotate housing 22. Alternatively, a motor in housing 22 causes housing 22 to rotate about the base. U.S. Pat. No. 5,680,208 provides examples of a rotary base solution for use in a laser alignment device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus comprising:
   a pendulum assembly, including:
      a coarse pendulum, and
      a fine pendulum coupled to said coarse pendulum;
   a laser beam source assembly mounted on said pendulum assembly, wherein said laser beam assembly provides a first laser beam.

2. The apparatus of claim 1, further including:
   a first motor coupled to said pendulum assembly; and
   a first reflective element coupled to said first motor to rotate in response to a rotational movement of said first motor, wherein said laser beam source assembly is aligned to provide said first laser beam to said first reflective element.

3. The apparatus of claim 2, further including:
   a second motor mounted on said pendulum assembly; and
   a second reflective element coupled to said second motor to rotate in response to a rotational movement of said second motor, wherein said laser beam source assembly is aligned to provide a second laser beam to said second reflective element.

4. The apparatus of claim 3, wherein said first laser beam is perpendicular to said second laser beam.

5. The apparatus of claim 3, wherein said first motor and said second motor are mounted on said coarse pendulum.

6. The apparatus of claim 5, wherein said first reflective surface and said second reflective surface are mounted on said coarse pendulum.

7. The apparatus of claim 6, wherein said laser beam source assembly is mounted on said fine pendulum.

8. The apparatus of claim 7, wherein said first reflective element is a penta-prism and said second reflective element is a penta-prism.

9. A laser alignment device comprising:
   a pendulum assembly;
   a first motor mounted on said pendulum assembly;
   a second motor mounted on said pendulum assembly;
   a first reflective element coupled to said first motor to rotate in response to a rotational movement of said first motor;
   a second reflective element coupled to said second motor to rotate in response to a rotational movement of said second motor; and
   a laser beam source assembly mounted on said pendulum assembly, wherein said laser beam source assembly is aligned to provide a first laser beam to said first reflective element and a second laser beam to said second reflective element.

10. The laser alignment device of claim 9, wherein said pendulum assembly includes:
    a coarse pendulum; and
    a fine pendulum mounted to said coarse pendulum.

11. The laser alignment device of claim 10, wherein said first motor and said second motor are mounted on said coarse pendulum.

12. The laser alignment device of claim 11, wherein said first reflective surface and said second reflective surface are mounted on said coarse pendulum.

13. The laser alignment device of claim 10, wherein said laser beam source assembly is mounted on said fine pendulum.

14. The laser alignment device of claim 9, wherein said first reflective element is a penta-prism and said second reflective element is a penta-prism.

15. The laser alignment device of claim 9, wherein said laser beam source assembly includes:
    a mounting block containing a first opening and a second opening;
    a first mounting joint secured in said first opening, wherein said first mounting joint includes a first front section located in said first opening and said first front section has a spherical surface; and
    a second mounting joint secured in said second opening, wherein said second mounting joint includes a second front section located in said second opening and said second front section has a spherical surface.

16. The laser alignment device of claim 15, wherein said laser beam source assembly includes:
    a first laser diode mounted in said first mounting joint; and
    a second laser diode mounted in said second mounting joint.

17. The laser alignment device of claim 16, wherein said laser beam source assembly includes:
    a first collimating lens mounted to receive a beam from said first laser diode; and
    a second collimating lens mounted to receive a beam from said second laser diode.

18. The laser alignment device of claim 9, wherein said laser beam source assembly includes:
    a mounting block, including a channel;
    a laser diode mounted in said channel;
    a reflective element mounted in said channel; and
    a collimating lens mounted in said channel between said laser diode and said reflective element,
    wherein said reflective element includes:
       a first reflective surface aligned at an angle to a collimated laser beam originating from said laser diode and passing through said collimating lens, and
       a second reflective surface aligned at an angle to a collimated laser beam originating from said laser diode and passing through said collimating lens.

19. The laser alignment device of claim 18, wherein said reflective element is a bi-mirror.

20. The laser alignment device of claim 9, further including:
    a housing;
    a mounting bracket pivotably mounted within said housing, wherein said mounting bracket supports said pendulum assembly;
    a yaw arm extending from said mounting bracket; and
    a yaw motor having a shaft, wherein a portion of said yaw arm rests against said shaft.

21. The laser alignment device of claim 20, wherein said mounting bracket pivots in response to a rotation of said shaft.

22. The laser alignment device of claim 9, further including:
    a control subsystem coupled to said first motor, wherein said control subsystem includes a processor readable storage medium having processor readable code embodied on said processor readable storage medium, said processor readable code for programming a processor to perform a method, said method comprising the steps of:
       (a) retrieving a positioning input for said first motor;
       (b) determining a first motor control signal frequency, in response to said positioning input;
       (c) determining a first motor control signal pulse width, in response to said positioning input; and (d) providing a first motor control signal to said first motor, wherein said first motor control signal has said first motor control signal frequency and said first motor control signal pulse width.

23. The laser alignment device of claim 22, wherein said positioning input corresponds to a period of time an input is selected.

24. The laser alignment device of claim 23, wherein said first motor control signal frequency has the following relationship to said period of time:

$$\text{Frequency} = \text{Minimum}([K_0 * 10^T], [f_{max}])$$

wherein:

Frequency is said first motor control signal frequency, $K_0 = 10^{Log(fmax) - IC1}$ $f_{max}$ is a maximum motor control signal frequency, $IC_1$ is a time at which $f_{max}$ occurs, and T is said period of time.

25. The laser alignment device of claim 23, wherein said first motor control signal pulse width has the following relationship to said period of time:

If T is less than or equal to $IC_1$, then $PW = PW_{ideal}$

If T is greater than $IC_1$, then $PW = \text{Minimum}([\text{Slope}*(T-IC_1) + PW_{ideal}], [PW_{max}])$ wherein:

$PW_{ideal}$ is an ideal pulse width, $IC_1$ is a time at which a maximum motor control signal frequency occurs, T is said period of time, PW is said first motor control signal pulse width, $\text{Slope} = (PW_{max} - PW_{ideal})/(IC_2 - IC_1)$ $PW_{max}$ is a maximum motor control signal pulse width, and $IC_2$ is a time at which $PW_{max}$ occurs.

26. The laser alignment device of claim 22, wherein said method further includes the step of:

(e) calibrating said first motor.

27. The laser alignment device of claim 26, wherein said step (e) includes the steps of:

(i) applying a calibration motor control signal to said first motor, wherein said calibration motor control signal has a calibration pulse width and a calibration frequency;

(ii) counting a number of pulses required to rotate through each element in a set of elements on an encoder coupled to said first motor;

(iii) determining an average number of pulses per encoder element for said first motor; and (iv) determining an ideal pulse width, based on said average number of pulses per encoder element.

28. The laser alignment device of claim 22, wherein said control subsystem is coupled to said second motor and said method further includes the steps of:

(f) retrieving a second positioning input for said second motor;

(g) determining a second motor control signal frequency, in response to said second positioning input;

(h) determining a second motor control signal pulse width, in response to said second positioning input; and (i) providing a second motor control signal to said second motor, wherein said second motor control signal has said second motor control signal frequency and said second motor control signal pulse width.

29. The laser alignment device of claim 9, wherein said first laser beam is perpendicular to said second laser beam.

30. The laser alignment device of claim 9, further including: a clutch/release mechanism coupled to said first motor.

31. The laser alignment device of claim 30, wherein said clutch/release mechanism includes:

a friction pad;

a weight coupled to said friction pad;

a pivot assembly coupling said friction pad to said weight; and a spring connected between a shaft of said first motor and said pivot assembly.

32. A laser alignment device comprising:

a housing;

a pendulum assembly;

a first motor mounted on said pendulum assembly, a second motor mounted on said pendulum assembly;

a first reflective element coupled to said first motor to rotate in response to a rotational movement of said first motor;

a second reflective element coupled to said second motor to rotate in response to a rotational movement of said second motor; and a mounting bracket pivotably mounted within said housing, wherein said mounting bracket supports said pendulum assembly;

a yaw arm extending from said mounting bracket; and a yaw motor having a shaft, wherein a portion of said yaw arm rests against said shaft.

33. The laser alignment device of claim 32, wherein said mounting bracket pivots in response to a rotation of said shaft.

34. The laser alignment device of claim 33, wherein said pendulum assembly includes:

a coarse pendulum; and a fine pendulum mounted to said coarse pendulum.

35. The laser alignment device of claim 34, wherein:

said first motor and said second motor are mounted on said coarse pendulum, and said first reflective surface and said second reflective surface are mounted on said coarse pendulum.

36. The laser alignment device of claim 35, including a laser beam source assembly mounted on said fine pendulum.

37. A laser alignment device comprising:

a pendulum assembly, including:

a coarse pendulum, and a fine pendulum mounted to said coarse pendulum;

a first motor mounted on said coarse pendulum;

a second motor mounted on said course pendulum;

a first reflective element mounted on said coarse pendulum and coupled to said first motor to rotate in response to a rotational movement of said first motor;

a second reflective element mounted to said coarse pendulum and coupled to said second motor to rotate in response to a rotational movement of said second motor; and a laser beam source assembly mounted on said fine pendulum, wherein said laser beam source assembly is aligned to provide a first laser beam to said first reflective element and a second laser beam to said second reflective element, wherein said laser beam source assembly includes:

a mounting block containing a first opening and a second opening, a first mounting joint secured in said first opening, wherein said first mounting joint includes a first front section located in said first opening and said first front section has a spherical surface, a second mounting joint secured in said second opening, wherein said second mounting joint includes a second front section located in said second opening and said second front section has a spherical surface, a first laser diode mounted in said first mounting joint, and a second laser diode mounted in said second mounting joint.

38. The laser alignment device of claim 37, further including:

a control subsystem coupled to said first motor and said second motor, wherein said control subsystem includes a processor readable storage medium having processor readable code embodied on said processor readable storage medium, said processor readable code for programming a processor to perform a method, said method comprising the steps of:

(a) retrieving a first positioning input for said first motor;

(b) determining a first motor control signal frequency, in response to said first positioning input;

(c) determining a first motor control signal pulse width, in response to said first positioning input;

(d) providing a first motor control signal to said first motor, wherein said first motor control signal has said first motor control signal frequency and said first motor control signal pulse width;

(e) retrieving a second positioning input for said second motor;

(f) determining a second motor control signal frequency, in response to said second positioning input;

(g) determining a second motor control signal pulse width, in response to said second positioning input; and (h) providing a second motor control signal to said second motor, wherein said second motor control signal has said second motor control signal frequency and said second motor control signal pulse width.

39. An apparatus comprising:

a housing;

a first rigid member mounted to said housing;

a second rigid member mounted to said housing;

a coarse pendulum mounted within said housing and having a first base, wherein said first base passes between said first rigid member and said second rigid member;

a fine pendulum mounted on said coarse pendulum and having a second base, wherein said second base passes between said first rigid member and said second rigid member;

a first set of magnets mounted on said first rigid member; and a second set of magnets mounted on said second rigid member.

40. The apparatus of claim 39, wherein said first base is made of a conductive material and said second base is made of a conductive material.

41. The apparatus of claim 39, further including:

a first motor mounted on said coarse pendulum;

a second motor mounted on said course pendulum;

a first reflective element mounted on said coarse pendulum and coupled to said first motor to rotate in response to a rotational movement of said first motor;

a second reflective element mounted to said coarse pendulum and coupled to said second motor to rotate in response to a rotational movement of said second motor; and a laser beam source assembly mounted on said fine pendulum, wherein said laser beam source assembly is aligned to provide a first laser beam to said first reflective element and a second laser beam to said second reflective element.

42. The apparatus of claim 39, wherein said coarse pendulum includes a pair of arms terminating in said first base and said fine pendulum includes a pair of arms terminating in said second base.

43. The apparatus of claim 42, wherein said pair of arms for said fine pendulum swing within said pair of arms for said coarse pendulum.

44. The apparatus of claim 39, further including:

a mounting bracket pivotably mounted within said housing, wherein said mounting bracket supports said coarse pendulum;

a yaw arm extending from said mounting bracket; and a yaw motor having a shaft, wherein a portion of said yaw arm rests against said shaft, and wherein said mounting bracket pivots in response to a rotation of said shaft.

45. An apparatus comprising:

a housing;

a pendulum assembly;

a support member rigidly mounted to said housing;

a mounting bracket mounted to said support member to pivot about a pivot point, wherein said mounting bracket supports said pendulum assembly;

an arm extending from said mounting bracket; and a motor having a shaft, wherein said shaft is in contact with a portion of said arm, and wherein said mounting bracket pivots in response to a rotation of said shaft.

46. The apparatus of claim 45, further including:

a first motor mounted on said pendulum assembly;

a second motor mounted on said pendulum assembly;

a first reflective element coupled to said first motor to rotate in response to a rotational movement of said first motor;

a second reflective element coupled to said second motor to rotate in response to a rotational movement of said second motor; and a laser beam source assembly mounted on said pendulum assembly, wherein said laser beam source assembly is aligned to provide a first laser beam to said first reflective element and a second laser beam to said second reflective element.

47. The apparatus of claim 45, further including:

a control subsystem coupled to said yaw motor, wherein said control subsystem includes a processor readable storage medium having processor readable code embodied on said processor readable storage medium, said processor readable code for programming a processor to perform a method, said method comprising the steps of:

(a) retrieving a positioning input for said yaw motor;
(b) determining a motor control signal, in response to said positioning input; and
(c) providing said motor control signal to said yaw motor.

48. A laser beam source assembly comprising:
a mounting block containing a first opening and a second opening;
a first mounting joint secured in said first opening, wherein said first mounting joint includes a first front section located in said first opening and said first front section has a spherical surface; and
a second mounting joint secured in said second opening, wherein said second mounting joint includes a second front section located in said second opening and said second front section has a spherical surface.

49. The laser beam source assembly of claim 48, wherein said laser beam source assembly includes:
a first laser diode mounted in said first mounting joint; and
a second laser diode mounted in said second mounting joint.

50. The laser beam source assembly of claim 49, wherein said laser beam source assembly includes:
a first collimating lens mounted to receive a beam from said first laser diode; and
a second collimating lens mounted to receive a beam from said second laser diode.

51. A method for positioning a motor, said method comprising the steps of:
(a) retrieving a positioning input indicating a distance the motor is to be rotated;
(b) determining a motor control signal frequency, in response to said positioning input;
(c) determining a motor control signal pulse width, in response to said positioning input; and
(d) providing a motor control signal to said motor, wherein said motor control signal has said motor control signal frequency and said motor control signal pulse width.

52. The method of claim 51, wherein said positioning input corresponds to a period of time an input is selected.

53. The method of claim 52, wherein said motor control signal frequency has the following relationship to said period of time:

$$\text{Frequency} = \text{Minimum}([K_0 * 10^T], [f_{max}])$$

wherein:
Frequency is said motor control signal frequency,
$K_0 = 10^{Log(fmax) - IC1}$
$f_{max}$ is a maximum motor control signal frequency,
$IC_1$ is a time at which fmax occurs, and
T is said period of time.

54. The method of claim 52, wherein said motor control signal pulse width has the following relationship to said period of time:

If T is less than or equal to $IC_1$, then $PW = PW_{ideal}$

If T is greater than $IC_1$, then $PW = \text{Minimum}([\text{Slope}*(T-IC_1) = PW_{ideal}], [PW_{max}])$ wherein:
$PW_{ideal}$ is an ideal pulse width,
T is said period of time,
PW is said motor control signal pulse width,
$\text{Slope} = (PW_{max} - PW_{ideal})/(IC_2 - IC_1)$,
$IC_1$ is a time at which a maximum motor control signal frequency occurs,
$PW_{max}$ is a maximum motor control signal pulse width, and
$IC_2$ is a time at which $PW_{max}$ occurs.

55. The method of claim 51, further including the step of:
(e) calibrating said motor.

56. The method of claim 55, wherein said step (e) includes the steps of:
(i) applying a calibration motor control signal to said motor, wherein said calibration motor control signal has a calibration pulse width and a calibration frequency;
(ii) counting a number of pulses required to rotate through each element in a set of elements on an encoder coupled to said motor;
(iii) determining an average number of pulses per encoder element;
(iv) determining an ideal pulse width, based on said average number of pulses per encoder element.

57. A processor readable storage medium having processor readable code embodied on said processor readable storage medium, said processor readable code for programming a processor to perform a method, said method comprising the steps of:
(a) retrieving a positioning input indicating a distance the motor is to be rotated;
(b) determining a motor control signal frequency, in response to said positioning input;
(c) determining a motor control signal pulse width, in response to said positioning input; and
(d) providing a motor control signal to said motor, wherein said motor control signal has said motor control signal frequency and said motor control signal pulse width.

58. The processor readable storage medium of claim 57, wherein said positioning input corresponds to a period of time an input is selected.

59. The processor readable storage medium of claim 58, wherein said motor control signal frequency has the following relationship to said period of time:

$$\text{Frequency} = \text{Minimum}([K_0 * 10^T], [f_{max}])$$

wherein:
Frequency is said motor control signal frequency,
$K_0 = 10^{Log(fmax) - IC1}$
$f_{max}$ is a maximum motor control signal frequency,
$IC_1$ is a time at which fmax occurs, and
T is said period of time.

60. The processor readable storage medium of claim 58, wherein said motor control signal pulse width has the following relationship to said period of time:

If T is less than or equal to $IC_1$, then $PW = PW_{ideal}$

If T is greater than $IC_1$, then $PW = \text{Minimum}([\text{Slope}*(T-IC_1) + PW_{ideal}], [PW_{max}])$ wherein:

$PW_{ideal}$ is an ideal pulse width,

T is said period of time,

PW is said motor control signal pulse width,

Slope=$(PW_{max}-PW_{ideal})/(IC_2-IC_1)$, $IC_1$ is a time at which a maximum motor control signal frequency occurs, $PW_{max}$ is a maximum motor control signal pulse width, and $IC_2$ is a time at which $PW_{max}$ occurs.

61. The processor readable storage medium of claim 57, further including the step of:

(e) calibrating said motor.

62. The processor readable storage medium of claim 61, wherein said step (e) includes the steps of:

(i) applying a calibration motor control signal to said motor, wherein said calibration motor control signal has a calibration pulse width and a calibration frequency;

(ii) counting a number of pulses required to rotate through each element in a set of elements on an encoder coupled to said motor;

(iii) determining an average number of pulses per encoder element;

(iv) determining an ideal pulse width, based on said average number of pulses per encoder element.

* * * * *

UNITED STATES PATENT AND TRADEMARK OFFICE
CERTIFICATE OF CORRECTION

PATENT NO. : 6,848,188 B2
DATED : February 1, 2005
INVENTOR(S) : Tacklind et al.

It is certified that error appears in the above-identified patent and that said Letters Patent is hereby corrected as shown below:

Column 19,
Line 62, after "(T-IC$_1$)" and before "PW", delete "=" and substitute with -- + --.

Signed and Sealed this

Twenty-ninth Day of November, 2005

JON W. DUDAS
*Director of the United States Patent and Trademark Office*